United States Patent
Mohammadnezhad et al.

(10) Patent No.: US 11,159,191 B1
(45) Date of Patent: Oct. 26, 2021

(54) WIRELESS AMPLIFIER CIRCUITRY FOR CARRIER AGGREGATION

(71) Applicant: Apple Inc., Cupertino, CA (US)

(72) Inventors: Seyed Mohammad Hossein Mohammadnezhad, San Diego, CA (US); Aly Ismail, San Diego, CA (US); Xi Yao, San Diego, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/019,037

(22) Filed: Sep. 11, 2020

(51) Int. Cl.
| | |
|---|---|
| *H04B 1/16* | (2006.01) |
| *H03F 3/19* | (2006.01) |
| *H03G 3/30* | (2006.01) |

(52) U.S. Cl.
CPC .................. *H04B 1/16* (2013.01); *H03F 3/19* (2013.01); *H03G 3/3036* (2013.01); *H03F 2200/294* (2013.01); *H03F 2200/451* (2013.01); *H03G 2201/103* (2013.01); *H03G 2201/307* (2013.01)

(58) Field of Classification Search
CPC ....... H04B 1/16; H03F 3/19; H03F 2200/294; H03F 2200/451; H03G 3/3036; H03G 2201/103; H03G 2201/307
See application file for complete search history.

(56) References Cited

U.S. PATENT DOCUMENTS

| | | | |
|---|---|---|---|
| 9,059,665 B2 | 6/2015 | Youssef et al. | |
| 9,479,131 B2 | 10/2016 | Youssef et al. | |
| 10,284,151 B2 | 5/2019 | Noori et al. | |
| 2015/0341007 A1* | 11/2015 | Youssef | H03G 1/0029 330/278 |
| 2015/0341859 A1* | 11/2015 | Youssef | H04B 1/005 455/552.1 |
| 2016/0164476 A1* | 6/2016 | Wang | H03F 1/223 330/250 |
| 2019/0305740 A1 | 10/2019 | Medra et al. | |

* cited by examiner

*Primary Examiner* — Nguyen T Vo
(74) *Attorney, Agent, or Firm* — Treyz Law Group, P.C.; Jason Tsai

(57) ABSTRACT

An electronic device may include wireless circuitry with a baseband processor, a transceiver circuit, a front-end module, and an antenna. The front-end module may include amplifier circuitry such as a low noise amplifier for amplifying received radio-frequency signals. The low noise amplifier is operable in a non-carrier-aggregation (NCA) mode and a carrier aggregation (CA) mode. The low noise amplifier may include a first input stage, a second input stage, a complementary degeneration transformer, and an input impedance compensation circuit. During the NCA mode, the first input stage is turned on while the second input stage is turned off, the degeneration transformer is controlled to provide maximum inductance, and the compensation circuit is turned on to provide input matching. During the CA mode, the first and second input stages are turned on, the degeneration transformer is adjusted to provide less inductance, and the compensation circuit is turned off.

20 Claims, 16 Drawing Sheets

WIRELESS AMPLIFIER CIRCUITRY FOR CARRIER AGGREGATION

FIELD

This application relates generally to electronic devices and, more particularly, to electronic devices with wireless communications circuitry.

BACKGROUND

Electronic devices are often provided with wireless communications capabilities. An electronic device with wireless communications capabilities has wireless communications circuitry with one or more antennas. Wireless receiver circuitry in the wireless communications circuitry uses the antennas to receive radio-frequency signals.

Signals received by the antennas are fed through a radio-frequency front-end module, which often includes a low noise amplifier for amplifying the received radio-frequency signals. It can be challenging to design satisfactory low noise amplifier circuitry for an electronic device.

SUMMARY

An electronic device may include wireless communications circuitry configured to receive radio-frequency signals from one or more base stations. The wireless communications circuitry may include an antenna, transceiver circuitry configured to receive radio-frequency signals from the antenna and to generate corresponding baseband signals, and a baseband processor configured to receive the baseband signals from the transceiver circuitry. The wireless communications circuitry may further include amplifier circuitry interposed on a radio-frequency transmission line path between the antenna and the transceiver circuitry. The amplifier circuitry may include low noise amplifier (LNA) circuitry configured to amplify radio-frequency signals received from the antenna.

An aspect of the disclosure provides amplifier circuitry operable in a carrier-aggregation mode and a non-carrier-aggregation mode. The amplifier circuitry can include an input port configured to receive radio-frequency signals from an antenna, a first amplifier having a first input coupled to the input port, a second amplifier having a second input coupled to the input port, degeneration transformer circuitry coupled to the first and second amplifiers, the degeneration transformer circuitry having a first set of switches configured to activate and deactivate at least a portion of the degeneration transformer circuitry in the non-carrier-aggregation mode and the carrier-aggregation mode, and an input impedance compensation circuit coupled to the input port. The input impedance compensation circuit can include a second set of switches configured to activate and deactivate at least a portion of the impedance compensation circuit in the non-carrier-aggregation mode and the carrier-aggregation mode.

The input impedance compensation circuit can include a first capacitor coupled to one of the second set of switches in series between the input port and a first portion of the degeneration transformer circuitry and a second capacitor coupled to another one of the second set of switches in series between the input port and a second portion of the degeneration transformer circuitry. The input impedance compensation circuit can include a first transistor coupled to one of the second set of switches in series between the input port and a first portion of the degeneration transformer circuitry and a second transistor coupled to another one of the second set of switches in series between the input port and a second portion of the degeneration transformer circuitry. The input impedance compensation circuit can include a first metal-oxide-semiconductor capacitor coupled to one of the second set of switches in series between the input port and a first portion of the degeneration transformer circuitry and a second metal-oxide-semiconductor capacitor coupled to another one of the second set of switches in series between the input port and a second portion of the degeneration transformer circuitry.

An aspect of this disclosure provides a method of operating amplifier circuitry. The method can include using an input to receive radio-frequency signals from an antenna, using a first amplifier sub-circuit to receive the radio-frequency signals from the input, using a second amplifier sub-circuit to receive the radio-frequency signals from the input, using the input to receive radio-frequency signals from one carrier frequency, activating the first amplifier sub-circuit, and deactivating the second amplifier sub-circuit in a non-carrier-aggregation mode, and using the input to receive radio-frequency signals from at least two component carrier frequencies and activating the first and second amplifier sub-circuits in a carrier-aggregation mode, using degeneration transformer circuitry coupled to the first and second amplifier sub-circuits to activate and deactivate a first set of switches to provide a first inductance in the non-carrier-aggregation mode and to provide a second inductance less than the first inductance in the carrier-aggregation mode, and using an input impedance compensation circuit coupled to the input to activate and deactivate a second set of switches to match an input impedance at the input when switching between the non-carrier-aggregation mode and the carrier-aggregation mode. The method can include turning on the input impedance compensation circuit to add capacitance to the input by activating the second set of switches in the non-carrier-aggregation mode, and turning off the input impedance compensation circuit by deactivating the second set of switches in the carrier-aggregation mode.

An aspect of the disclosure provides an electronic device operable in a carrier-aggregation mode and a non-carrier-aggregation mode. The electronic device can include an antenna configured to receive radio-frequency signals, a transceiver configured to generate baseband signals based on the radio-frequency signals, a baseband processor configured to receive the baseband signals, and amplifier circuitry configured to receive the radio-frequency signals from the antenna and to output corresponding amplified signals to the transceiver. The amplifier circuitry can include a first amplifier with a first carrier aggregation output, a second amplifier with a second carrier aggregation output, degeneration transformer circuitry coupled to the first and second amplifiers, and an input impedance compensation circuit having switches configured to enable and disable at least a portion of the input impedance compensation circuit in the non-carrier-aggregation mode and the carrier-aggregation mode.

The degeneration transformer circuitry can include first and second primary coil windings with a first center tap, first and second secondary coil windings with a second center tap, a first switch coupled in series between the first and second primary coil windings and a first power supply line, the first switch being configured to activate and deactivate at least the first primary coil winding in the non-carrier-aggregation mode and the carrier-aggregation mode, a second switch coupled between the first center tap and the first power supply line, the second switch being configured to activate and deactivate at least the second primary coil winding in the non-carrier-aggregation mode and the carrier-aggregation mode, a third switch coupled in series between the first and second secondary coil windings and a second power supply line, the third switch being configured to activate and deactivate at least the first secondary coil winding in the non-carrier-aggregation mode and the carrier-aggregation mode, and a fourth switch coupled between the second center tap and the second power supply line, the fourth switch being configured to activate and deactivate at least the second secondary coil winding in the non-carrier-aggregation mode and the carrier-aggregation mode.

DETAILED DESCRIPTION

Figure 1:
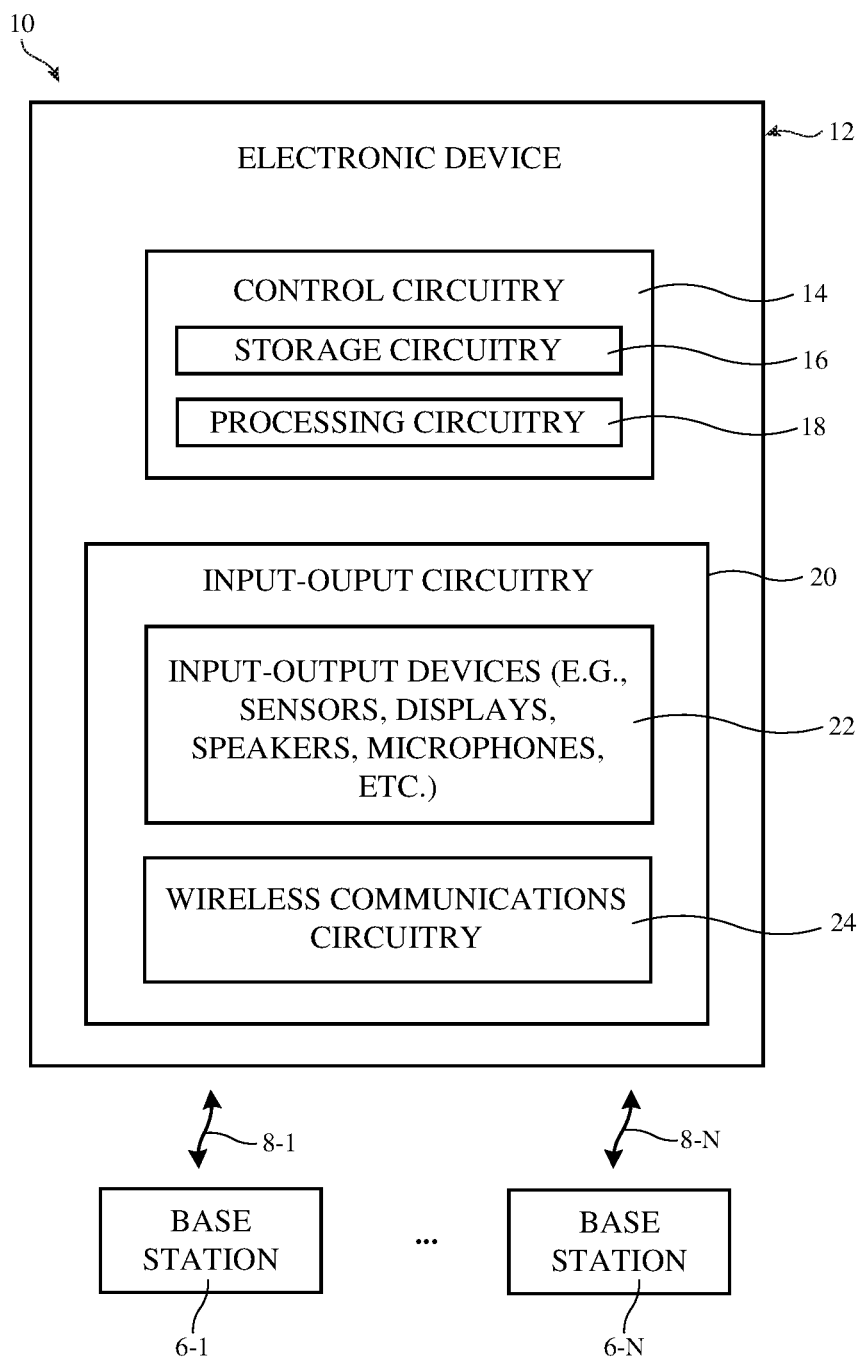
FIG. 1 is a diagram of an illustrative electronic device with wireless communications circuitry configured to wirelessly communicate with multiple external devices in accordance with some embodiments.

An electronic device such as electronic device 10 of FIG. 1 may be provided with wireless circuitry. The wireless circuitry may include an amplifier such as a low noise amplifier operable in a non-carrier-aggregation mode to support communications at one frequency with a single base station or in a carrier-aggregation mode to support communications at multiple frequencies with at least two different base stations. The low noise amplifier may include a radio-frequency input port having an input impedance, at least two separate input stages coupled to the radio-frequency input port, a degeneration transformer configurable to adjust the gain of the low noise amplifier, and an input impedance compensation circuit coupled to the input port. A low noise amplifier design that uses a degeneration transformer offers a compact circuit layout while providing improved linearity. The input impedance compensation circuit may be switched in and out of use to maintain input impedance matching during the two modes. One or more of these components within the low noise amplifier may further be adjusted to maintain input impedance matching when switching from operating in a high (nominal) gain mode to operating in a low (reduced) gain mode.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the schematic diagram FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G New Radio (NR) protocols, etc.), MIMO protocols, antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays, light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, electronic pencil (e.g., a stylus), and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 24 may include wireless communications circuitry such as wireless communications circuitry 34 (sometimes referred to herein as wireless circuitry 24) for wirelessly conveying radio-frequency signals. While control circuitry 14 is shown separately from wireless communications circuitry 24 for the sake of clarity, wireless communications circuitry 24 may include processing circuitry that forms a part of processing circuitry 18 and/or storage circuitry that forms a part of storage circuitry 16 of control circuitry 14 (e.g., portions of control circuitry 14 may be implemented on wireless communications circuitry 24). As an example, control circuitry 14 (e.g., processing circuitry 18) may include baseband processor circuitry or other control components that form a part of wireless communications circuitry 24.

Wireless communications circuitry 24 may include radio-frequency (RF) transceiver circuitry formed from one or more integrated circuits, power amplifier circuitry configured to amplify uplink radio-frequency signals (e.g., radio-frequency signals transmitted by device 10 to an external device), low-noise amplifiers configured to amplify downlink radio-frequency signals (e.g., radio-frequency signals received by device 10 from an external device), passive radio-frequency components, one or more antennas, transmission lines, and other circuitry for handling radio-frequency wireless signals. Wireless signals can also be sent using light (e.g., using infrared communications).

Wireless circuitry 24 may include radio-frequency transceiver circuitry for handling transmission and/or reception of radio-frequency signals in various radio-frequency communications bands. For example, the radio-frequency transceiver circuitry may handle wireless local area network (WLAN) communications bands such as the 2.4 GHz and 5 GHz Wi-Fi® (IEEE 802.11) bands, wireless personal area network (WPAN) communications bands such as the 2.4 GHz Bluetooth® communications band, cellular telephone communications bands such as a cellular low band (LB) (e.g., 600 to 960 MHz), a cellular low-midband (LMB) (e.g., 1400 to 1550 MHz), a cellular midband (MB) (e.g., from 1700 to 2200 MHz), a cellular high band (HB) (e.g., from 2300 to 2700 MHz), a cellular ultra-high band (UHB) (e.g., from 3300 to 5000 MHz), or other cellular communications bands between about 600 MHz and about 5000 MHz (e.g., 3G bands, 4G LTE bands, 5G New Radio Frequency Range 1 (FR1) bands below 10 GHz, 5G New Radio Frequency Range 2 (FR2) bands at millimeter and centimeter wavelengths between 20 and 60 GHz, etc.), a near-field communications (NFC) band (e.g., at 13.56 MHz), satellite navigations bands (e.g., an L1 global positioning system (GPS) band at 1575 MHz, an L5 GPS band at 1176 MHz, a Global Navigation Satellite System (GLONASS) band, a BeiDou Navigation Satellite System (BDS) band, etc.), an ultra-wideband (UWB) communications band supported by the IEEE 802.15.4 protocol and/or other UWB communications protocols (e.g., a first UWB communications band at 6.5 GHz and/or a second UWB communications band at 8.0 GHz), and/or any other desired communications bands. The communications bands handled by such radio-frequency transceiver circuitry may sometimes be referred to herein as frequency bands or simply as "bands," and may span corresponding ranges of frequencies. In general, the radio-frequency transceiver circuitry within wireless circuitry 24 may cover (handle) any desired frequency bands of interest.

Device 10 can communicate with external devices such as accessories, computing equipment, and wireless networks over wired and wireless communications paths. For example, device 10 may communicate with wireless network equipment such as one or more cellular telephone base stations 6 over corresponding wireless links 8. In the example of FIG. 1, one or more of antennas in wireless communications circuitry 24 may communicate with a first base station 6-1 over a first communications link 8-1, may communicate with a second base station 6-N over a second communications link 8-N, or may simultaneously communicate with base stations 6-1 and 6-N over both communications links 8-1 and 8-N, respectively. In one embodiment, wireless communications circuitry 24 may simultaneously convey information with first base station 6-1 in a first communications band associated with link 8-1 and second base station 6-N in a second communications band associated with link 8-N in a scheme sometimes referred to as carrier aggregation.

When operating using a carrier aggregation scheme, the first base station 6 with which device 10 establishes a corresponding wireless link 8 may sometimes be referred to herein as a Primary Component Carrier (PCC) or primary base station. Radio-frequency signals conveyed between the primary base station and device 10 may sometimes be referred to herein as primary component carrier signals, primary signals, primary component signals, primary carrier signals, or PCC signals, and the wireless link 8 between the primary base station and device 10 may sometimes be referred to herein as a primary connection or primary wireless link. Once a connection is established between device 10 and the primary base station, device 10 may establish an additional wireless connection with another base station 6 without dropping the connection with the primary base station, and may simultaneously communicate with both base stations (e.g., using different frequency bands in a carrier aggregation scheme). Additional base stations that establish a connection with device 10 after device 10 has established a wireless connection with a primary base station may sometimes be referred to herein as Secondary Component Carriers (SCCs) or secondary base stations. Radio-frequency signals conveyed between the secondary base station and device 10 may sometimes be referred to herein as secondary component carrier signals, secondary signals, secondary component signals, secondary carrier signals, or SCC signals, and the wireless link 8 between the secondary base station and device 10 may sometimes be referred to herein as secondary connections or secondary wireless links. Device 10 may establish a connection with a primary base station and one or more secondary base stations in downlink and uplink communications bands if desired.

Combining data from multiple component carriers using carrier aggregation can dramatically increase data throughput. As examples, wireless communications circuitry 24 may be configured to aggregate data streams from at least two component carriers, up to five component carriers, two to five component carriers, more than five component carriers, up to 16 component carriers, 5-16 component carriers, more than 16 component carriers, up to 32 component carriers, 16-32 component carriers, more than 32 component carriers, up to 64 component carriers, 32-64 component carriers, more than 64 component carriers, 64-100 component carriers, more than 100 component carriers, hundreds of component carriers, less than 100 component carriers, less than 64 component carriers, less than 32 component carriers, or other suitable number of component carriers. The combined bandwidth from aggregating multiple component carriers in this way can be as high as 100 MHz or more, 200 MHz or more, 300 MHz or more, 400 MHz or more, 500 MHz or more, 500 MHz to 1 GHz, or even greater than 1 GHz.

The various component carriers being aggregated may or may not belong to the same frequency band. Scenarios in which multiple component carriers within the same frequency band are being aggregated are sometimes referred to intra-band carrier aggregation. In particular, if the multiple component carriers within the same frequency band are in contiguous frequency blocks without any frequency gaps separating them, such type of intra-band aggregation may further be referred to as intra-band contiguous carrier aggregation. If the multiple component carriers within the same frequency band are in noncontiguous frequency blocks that are separated by one or more frequency gaps, such type of intra-band aggregation may further be referred to as intra-band noncontiguous carrier aggregation. In yet other scenarios, multiple component carriers from different frequency bands may be aggregated together. Such type of carrier aggregation may be referred to as inter-band carrier aggregation.

In general, carrier aggregation may combine component carriers from 3G bands, 4G LTE bands, 5G NR bands, or other cellular telephone communications bands, WLAN communications bands, WPAN communications bands, the NFC band, the GPS bands, the GLONASS band, the UWB communications band, a combination of these bands, or other desired communications bands. As an example, multiple contiguous or noncontiguous component carriers in one or more 4G LTE bands may be aggregated together to perform 4G LTE carrier aggregation. As another example, multiple contiguous or noncontiguous component carriers in or more 5G NR bands may be aggregated together to perform 5G NR carrier aggregation. As another example, one or more component carriers from a 4G LTE band may be aggregated with one or more component carriers from a 5G NR band to perform dual connectivity carrier aggregation. As another example, multiple component carriers from two or more 4G LTE frequency bands may be aggregated with multiple component carriers from two or more 5G NR frequency bands. As another example, component carriers from one or more 4G LTE frequency bands may be aggregated with another type of cellular technology band (e.g., one or more GSM frequency bands, one or more EDGE frequency bands, one or more 3G frequency bands, one or more 5G NR frequency bands, etc.). As another example, component carriers from one or more 5G NR frequency bands may be aggregated with another type of cellular technology band (e.g., one or more GSM frequency bands, one or more EDGE frequency bands, one or more 3G frequency bands, one or more LTE frequency bands, etc.). These examples are merely illustrative. In general, any number of contiguous or noncontiguous component carriers from one or more frequency bands associated with any suitable wireless communications protocol may be aggregated together to help boost data throughput for wireless communications circuitry 24.

Figure 2:
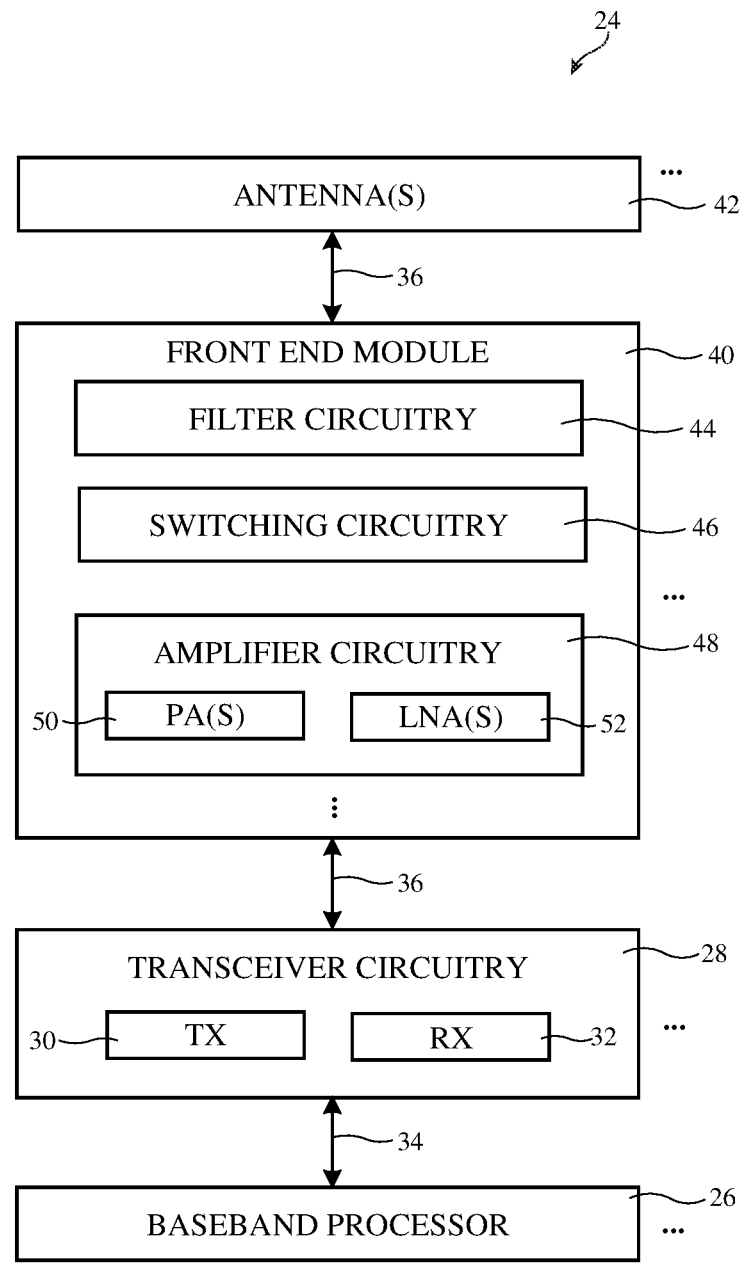
FIG. 2 is a diagram of illustrative wireless communications circuitry having a front-end module coupled between antennas and transceiver circuitry in accordance with some embodiments.

FIG. 2 is a diagram showing illustrative components within wireless circuitry 24. As shown in FIG. 2, wireless circuitry 24 may include a baseband processor such as baseband processor 26, radio-frequency (RF) transceiver circuitry such as radio-frequency transceiver 28, radio-frequency front end circuitry such as radio-frequency front end module (FEM) 40, and antenna(s) 42. Baseband processor 26 may be coupled to transceiver 28 over baseband path 34. Transceiver 28 may be coupled to antenna 42 via radio-frequency transmission line path 36. Radio-frequency front end module 40 may be interposed on radio-frequency transmission line path 36 between transceiver 28 and antenna 42.

In the example of FIG. 2, wireless circuitry 24 is illustrated as including only a single baseband processor 26, a single transceiver 28, a single front end module 40, and a single antenna 42 for the sake of clarity. In general, wireless circuitry 24 may include any desired number of baseband processors 26, any desired number of transceivers 36, any desired number of front end modules 40, and any desired number of antennas 42. Each baseband processor 26 may be coupled to one or more transceiver 28 over respective baseband paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 interposed thereon. If desired, two or more front end modules 40 may be interposed on the same radio-frequency transmission line path 36. If desired, one or more of the radio-frequency transmission line paths 36 in wireless circuitry 24 may be implemented without any front end module interposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards. In one embodiment, radio-frequency transmission line paths such as radio-frequency transmission line path 36 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

In performing wireless transmission, baseband processor 26 may provide baseband signals to transceiver 28 over baseband path 34. Transceiver 28 may further include circuitry for converting the baseband signals received from baseband processor 26 into corresponding radio-frequency signals. For example, transceiver circuitry 28 may include mixer circuitry for up-converting (or modulating) the baseband signals to radio-frequencies prior to transmission over antenna 42. Transceiver circuitry 28 may also include digital-to-analog converter (DAC) and/or analog-to-digital converter (ADC) circuitry for converting signals between digital and analog domains. Transceiver 28 may use transmitter 30 to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry for converting the received radio-frequency signals into corresponding baseband signals. For example, transceiver 28 may include mixer circuitry for down-converting (or demodulating) the received radio-frequency signals to baseband frequencies prior to conveying the received signals to baseband processor 26 over baseband path 34.

Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be interposed within radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, baseband processor 26 and/or portions of transceiver 28 (e.g., a host processor on transceiver 28) may form a part of control circuitry 14. Control circuitry 14 (e.g., portions of control circuitry 14 formed on baseband processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

As described above, front end module 40 may include one or more low noise amplifier (LNA) circuits 52 in the receive (downlink) path. A low noise amplifier 52 (sometimes referred to as low noise amplifier circuitry or amplifier circuitry) may be configured to amplify a received radio-frequency signal without significantly degrading the signal-to-noise (SNR) ratio of the amplified signal. Low noise amplifier 52 may, for example, be used to provide 2 dB of voltage gain, 3 dB of voltage gain, 4 dB of voltage gain, 5 dB of voltage gain, 6 dB of voltage gain, 3-4 dB of voltage gain, 2-5 dB of voltage gain, 5-10 dB of voltage gain, or other suitable amounts of voltage gain. In device 10 that supports carrier aggregation of multiple component carriers, device 10 may include one or more low noise amplifiers 52 operable in a non-carrier-aggregation (NCA) mode and a carrier-aggregation (CA) mode. Ideally, the gain and the input matching characteristics associated with the low noise amplifier should be identical in both the NCA and CA modes of operation. If care is not taken in the low noise amplifier design, however, the gain and input impedance of the low noise amplifier circuitry may be mismatched when switching from the NCA mode to the CA mode and vice versa.

Figure 3:
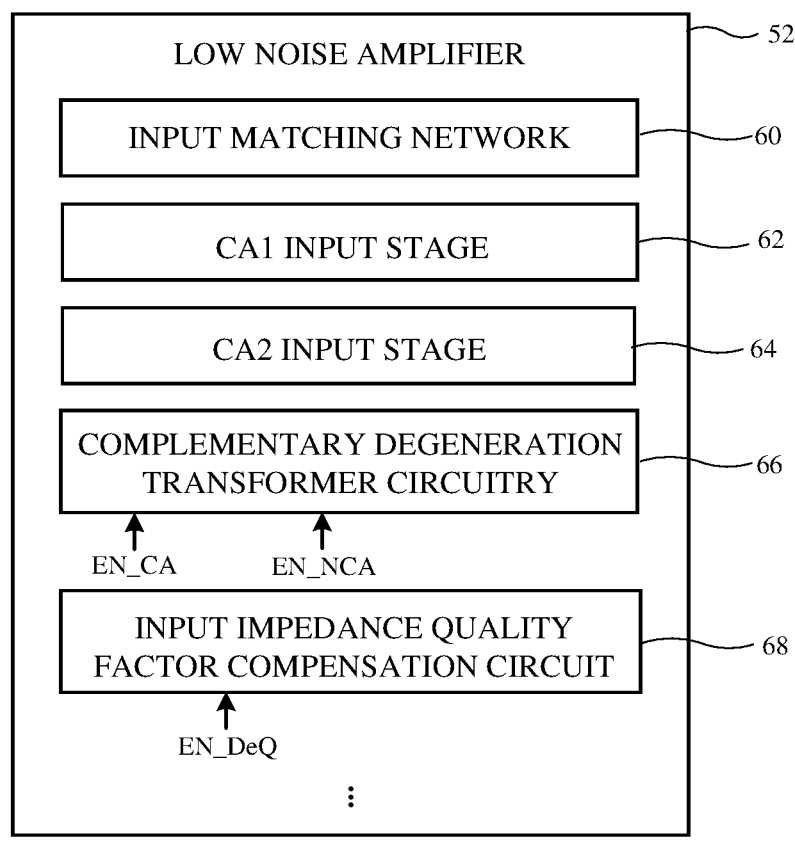
FIG. 3 is a schematic diagram of an illustrative low noise amplifier in accordance with some embodiments.

In one embodiment, low noise amplifier (LNA) 52 configured to maintain the input matching characteristics of the amplifier while sustaining the same amount of gain in both the non-carrier-aggregation mode and the carrier-aggregation mode is provided. During the non-carrier-aggregation mode, the LNA may receive signals from one carrier (or one component carrier). During the carrier-aggregation mode, the LNA may receive signals from multiple component carriers (i.e., from at least two different component carriers). FIG. 3 is a diagram showing low noise amplifier 52 operable to maintain the input matching characteristics of the low noise amplifier while maintaining the same amount of gain in both NCA and CA modes of operation. As shown in FIG. 3, low noise amplifier 52 may include an input matching network such as input matching network 60, multiple input stages such as first input stage 62 and second input stage 64, a degeneration circuit such as a complementary degeneration transformer circuitry 66, and an input impedance adjustment circuit such as input impedance quality factor compensation circuit 68. Input matching network 60 may be configured to provide a proper input impedance at the input port of low noise amplifier 52 to help provide maximal power transfer while minimizing signal reflection back to the preceding stage. The first input stage 62 is sometimes referred to as a first amplifier, first amplifier sub-circuit, or first amplifier portion, whereas the second input stage 64 is sometimes referred to as a second amplifier, second amplifier sub-circuit, or a second amplifier portion.

Only one of the two input stages may be activated during the NCA mode. For example, only the first input stage 62 might be activated during the NCA mode (while the second input stage 64 is idle). If desired, only the second input stage 62 might be activated during the NCA mode (while idling the first input stage 62). During the CA mode, both the first and second input stages 62 and 64 may be simultaneously enabled to receive signals from multiple different component carriers (e.g., from a primary component carrier and a secondary component carrier). Thus, the first input stage 62 may sometimes be referred to herein as a first carrier aggregation (CA1) input stage, whereas the second input stage 64 may sometimes be referred to herein as a second carrier aggregation (CA2) input stage. The output CA1 of the first input stage 62 may be coupled to a first mixer for down-converting (demodulating) signals associated with the primary component carrier to baseband. The output CA2 of the second input stage 64 may be coupled to a second mixer for down-converting (demodulating) signals associated with the secondary component carrier to baseband. The first and second mixer circuits may be considered part of the transceiver circuitry 28 (e.g., part of one or more receiver circuits 32). Although only two input stages are shown in FIG. 3, low noise amplifier 52 may optionally include three or more input stages (e.g., amplifier 52 may include three input stages, four input stages, five input stages, two to five input stages, more than five input stages, five to 16 input stages, 16 to 32 input stages, 32 to 64 input stages, more than 64 input stages, or any suitable number of input stages to receive signals from any desired number of component carriers).

Degeneration transformer circuitry 66 may include inductor components and associated switches that are coupled to the source terminals of the input stages. Degeneration transformer circuitry 66 may include primary windings (inductor coils) coupled to a first source terminal of the input stages and may include secondary windings (inductor coils) coupled to a second source terminal of the input stages. The first source terminal may be connected to source terminals of n-type transistor devices, whereas the second source terminal may be connected to source terminals of p-type transistor devices. Such configuration in which different portions of the transformer coil windings are connected to source terminals of both n-type and p-type devices in amplifier 52 is sometimes referred to as complementary degeneration. The transformer within circuitry 66 may also have an associated quality (Q) factor. The Q factor of the degeneration transformer may be low. For example, the Q factor of the degeneration transformer may be no greater than 10, no greater than 11, no greater than 12, less than 15, less than 20, 10 to 12, 9 to 13, 8 to 14, 7 to 15, or other suitable low quality factor value. Using a degeneration transformer with such low Q factor values can help minimize the area required to fabricate the transformer, which keeps the overall size of low noise amplifier 52 relatively compact.

Forming inductor components at the source terminals within low noise amplifier 52 (a technique sometimes referred to as source degeneration) may affect the gain and the input impedance of the low noise amplifier. As an example, increasing the overall inductance of degeneration transformer circuitry 66 may reduce the voltage gain of amplifier 52. Thus, decreasing the overall inductance of degeneration transformer circuitry 66 may increase the voltage gain of amplifier 52. The inductance of the degeneration transformer may also affect a quality factor (Q factor) associated with the input impedance of amplifier 52. As an example, decreasing the overall inductance of degeneration transformer circuitry 66 may increase the Q factor of the input impedance. Thus, increasing the overall inductance of degeneration transformer circuitry 66 may reduce the Q factor of the input impedance. Degeneration transformer circuitry 66 may receive control signals such as a carrier-aggregation mode enable signal EN_CA and a non-carrier-aggregation mode enable signal EN_NCA. Signal EN_CA may be asserted (e.g., driven high) during the carrier-aggregation mode (while signal EN_NCA is deasserted or driven low), whereas signal EN_NCA may be asserted (e.g., driven high) during the non-carrier-aggregation mode (while signal EN_CA is deasserted or driven low). Asserting signal EN_CA during the carrier-aggregation mode may reduce the overall inductance of degeneration transformer circuitry 66, whereas asserting signal EN_NCA during the non-carrier-aggregation mode may increase the overall inductance of degeneration transformer circuitry 66.

As described above, adjusting the degeneration transformer circuitry 66 when switching between the NCA and CA modes of operation will change Q factor of the input impedance. To maintain the Q factor of the input impedance between the two modes of operation, low noise amplifier 52 may selectively switch input impedance Q factor compensation circuit 68 in and out of use depending on the current mode of operation. Input impedance compensation circuit 68 may be coupled to the input port of amplifier 52 and may provide additional capacitance to the amplifier input port. Input impedance Q factor compensation circuit 68 may receive a control signal such as a decrease-Q-factor enable signal EN_DeQ. When signal EN_DeQ is asserted (e.g., driven high), compensation circuit 68 may be activated or switched into use to provide additional capacitance at the amplifier input port. Inserting additional capacitance at the amplifier input port may decrease the quality factor of the input impedance. Operated in this way, compensation circuit 68 may sometimes be referred to herein as an amplifier input impedance quality factor reduction circuit or an input impedance control circuit. When signal EN_DeQ is deasserted (e.g., driven low), input impedance Q factor compensation circuit 68 may be deactivated or switched out of use to effectively remove the additional capacitance at the amplifier input port.

The various constituent components 60, 62, 64, 66, and 68 that are part of amplifier 52 shown in FIG. 3 are merely illustrative. If desired, any of these components might optionally be excluded from low noise amplifier 52. If desired, low noise amplifier 52 may also include other components necessary to enable proper amplification without introducing excessive noise. The enable signals EN_CA, EN_NCA, and EN_DeQ may be asserted and deasserted using baseband processor 26, control circuitry 14, or other control circuitry or processor within wireless circuitry 24.

Figure 4:
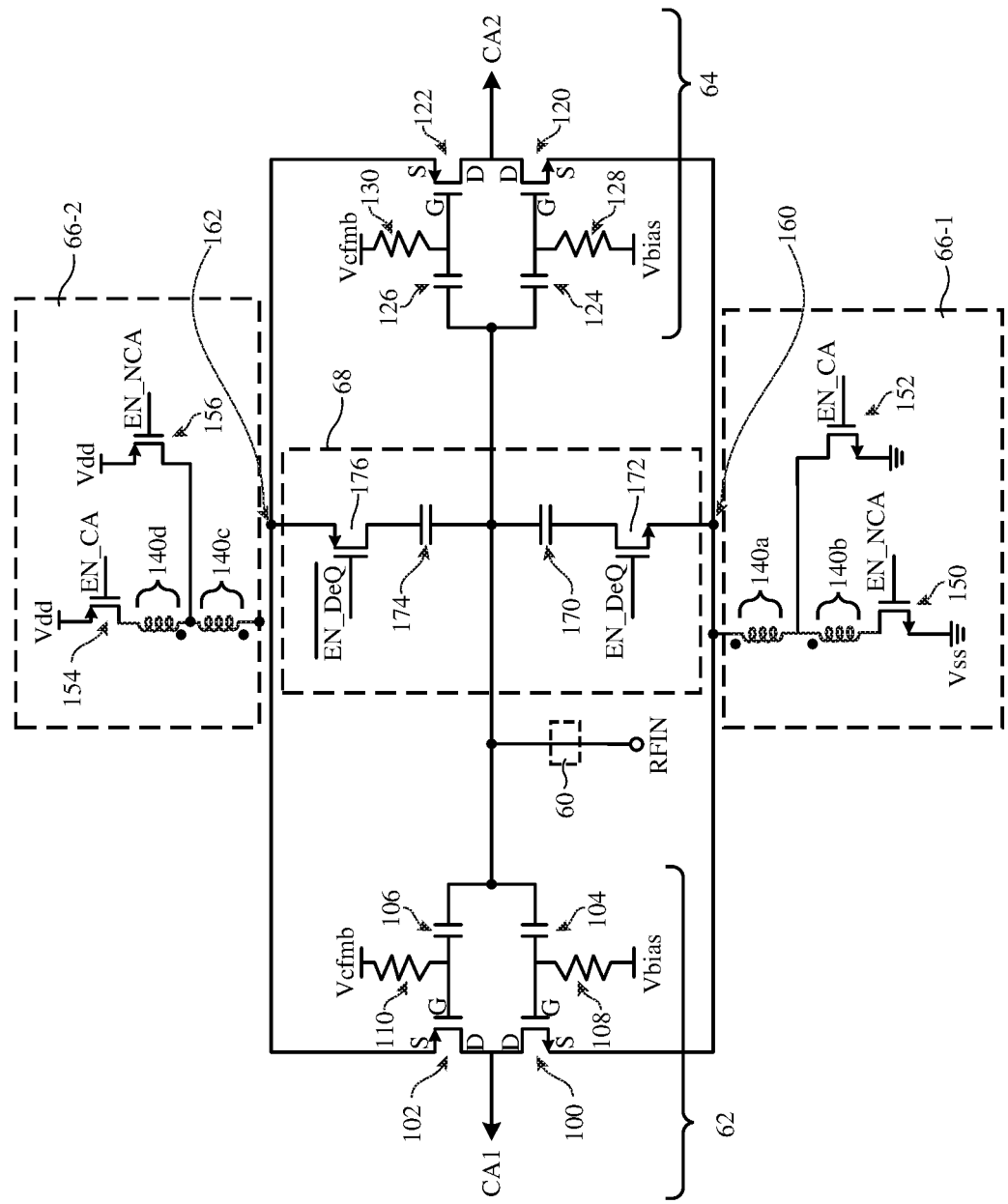
FIG. 4 is a circuit diagram showing an illustrative implementation of a low noise amplifier of the type shown in FIG. 3 in accordance with some embodiments.

FIG. 4 is a circuit diagram illustrating one embodiment of low noise amplifier 52. As shown in FIG. 4, low noise amplifier 52 may include an input port (terminal) RFIN configured to receive a radio-frequency input signal from the antenna. As described in connection with FIG. 2, one or more circuits such as filter circuitry, switching circuitry, antenna tuning circuitry, and/or other control circuitry may optionally be coupled along the radio-frequency transmission line path between the antenna and the amplifier input port RFIN. A local input matching network such as input matching network 60 may be coupled to input terminal RFIN.

Figure 5:
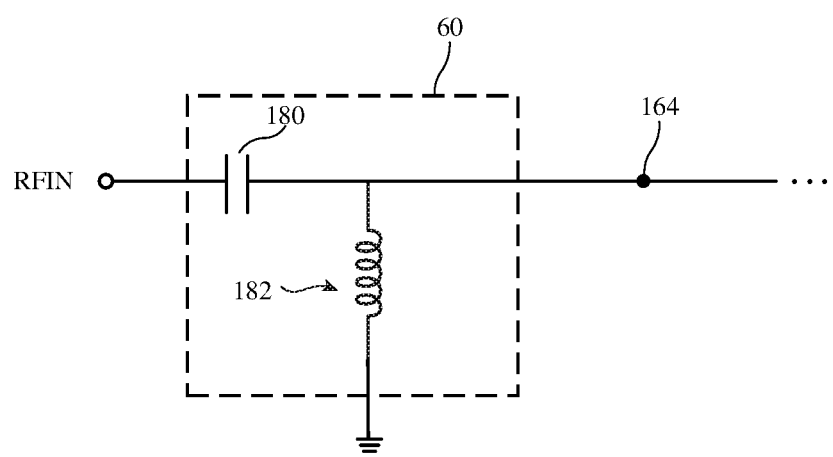
FIG. 5 is a diagram of an illustrative input matching network in accordance with some embodiments.

FIG. 5 is a diagram of an illustrative input matching network 60. As shown, input matching network 60 may include a series capacitor such as capacitor 180 with a first terminal coupled to the RFIN port and a second terminal coupled to node 164. Node 164 may be coupled to the first input stage 62 and the second input stage 64. Input matching network 60 may further include a shunt inductor such as inductor 182 having a first terminal coupled to node 164 and a second terminal coupled to a ground power supply line (sometimes referred to as ground line). This example in which input matching network 60 includes a series capacitor 180 and a shunt inductor 182 coupled to input RFIN is merely illustrative. As another example, input matching network 60 might include three or more passive components (e.g., capacitors, inductors, and/or resistors) coupled in some series/shunt configuration. As another example, input matching network 60 might include four or more passive components coupled in some series/shunt configuration. In general, input matching network 60 may include any suitable number of passive components connected in a hybrid series-shunt configuration.

First input stage 62 and second input stage 64 (referring back to FIG. 4) may be coupled to amplifier input RFIN. First input stage 62 may include transistors 100 and 102 coupled in series between source nodes 160 and 162. Transistor 100 may be an n-type transistor (e.g., an n-channel transistor such as an n-type metal-oxide-semiconductor or NMOS device). Transistor 102 may be a p-type transistor (e.g., a p-channel transistor such as a p-type metal-oxide-semiconductor or PMOS device). N-type transistor 100 may have a source (S) terminal coupled to source node 160, a gate (G) terminal coupled to input RFIN via coupling capacitor 104, and a drain (D) terminal coupled to an output of the first input stage (see output port CA1). P-type transistor 102 may have a source (S) terminal coupled to source node 162, a gate (G) terminal coupled to input RFIN via coupling capacitor 106, and a drain (D) terminal coupled to the CA1 output port.

The terms "source" and "drain" are sometimes used interchangeably when referring to a transistor. The source and drain terminals are therefore sometimes referred to as source-drain terminals (e.g., a transistor has a gate terminal and first and second source-drain terminals). The gate terminal of transistor 100 may further be coupled to resistor 108, which is configured to receive a bias voltage Vbias. Voltage Vbias may have some intermediate voltage level between the ground voltage level and a positive power supply voltage level Vdd that powers amplifier 52. The gate terminal of transistor 102 may further be coupled to resistor 110, which is configured to receive a common mode feedback voltage Vcfmb. Voltage Vcfmb may be generated using a common mode feedback circuit (not shown for the sake of clarity) that may or may not be part of amplifier 52. Voltage Vcfmb may exhibit some intermediate voltage level between the ground voltage level and positive power supply voltage level Vdd.

Second input stage 64 may include transistors 120 and 122 coupled in series between source nodes 160 and 162. Transistor 120 may be an n-type transistor (e.g., an n-channel transistor such as an n-type metal-oxide-semiconductor or NMOS device). Transistor 122 may be a p-type transistor (e.g., a p-channel transistor such as a p-type metal-oxide-semiconductor or PMOS device). N-type transistor 120 may have a source (S) terminal coupled to source node 160, a gate (G) terminal coupled to input RFIN via coupling capacitor 124, and a drain (D) terminal coupled to an output of the second input stage (see output port CA2). P-type transistor 122 may have a source (S) terminal coupled to source node 162, a gate (G) terminal coupled to input RFIN via coupling capacitor 126, and a drain (D) terminal coupled to the CA2 output port. The gate terminal of transistor 120 may further be coupled to resistor 128, which is configured to receive bias voltage Vbias. The gate terminal of transistor 122 may further be coupled to resistor 130, which is configured to receive common mode feedback voltage Vcfmb.

A first portion of degeneration transformer circuitry (see sub-circuit 66-1) may be coupled to source node 160. First transformer circuitry portion 66-1 may include primary windings 140a and 140b. Primary winding 140b may be coupled to the ground line (e.g., a ground power supply line on which ground voltage Vss is provided) via an n-type switching transistor 150. The center tap of the primary windings may be coupled to the ground line via another n-type switching transistor 152. Transistor 150 may have a gate terminal configured to receive non-carrier-aggregation enable signal EN_NCA. Transistor 152 may have a gate terminal configured to receive carrier-aggregation enable signal EN_CA. During non-CA (NCA) mode, signal EN_NCA is driven high (turning on n-type active-high transistor 150) while signal EN_CA is driven low (turning off n-type transistor 152), so both primary windings 140a and 140b are active (e.g., the full inductance of sub-circuit 66-1 is enabled). During CA mode, signal EN_CA is driven high (turning on switch 152) while signal EN_NCA is driven low (turning off switch 150), so only primary winding 140a is active (e.g., only half the inductance of sub-circuit 66-1 is switched into use).

A second portion of degeneration transformer circuitry (see sub-circuit 66-2) may be coupled to source node 162. Second transformer circuitry portion 66-2 may include secondary windings 140c and 140d. Secondary winding 140d may be coupled to the positive power supply line (e.g., a positive power supply terminal on which Vdd is provided) via a p-type switching transistor 154. The center tap of the secondary windings may be coupled to the positive power supply line via another p-type switching transistor 156. Transistor 156 may have a gate terminal configured to receive non-carrier-aggregation enable signal EN_NCA. Transistor 154 may have a gate terminal configured to receive carrier-aggregation enable signal EN_CA. During non-CA (NCA) mode, signal EN_CA is driven low (turning on p-type active-low transistor 154) while signal EN_NCA is driven high (turning off p-type transistor 156), so both secondary windings 140c and 140d are active (e.g., the full inductance of sub-circuit 66-2 is enabled). During CA mode, signal EN_CA is driven high (turning off switch 154) while signal EN_NCA is driven low (turning on switch 156), so only secondary winding 140c is active (e.g., only half the inductance of sub-circuit 66-2 is switched into use).

Figure 6:
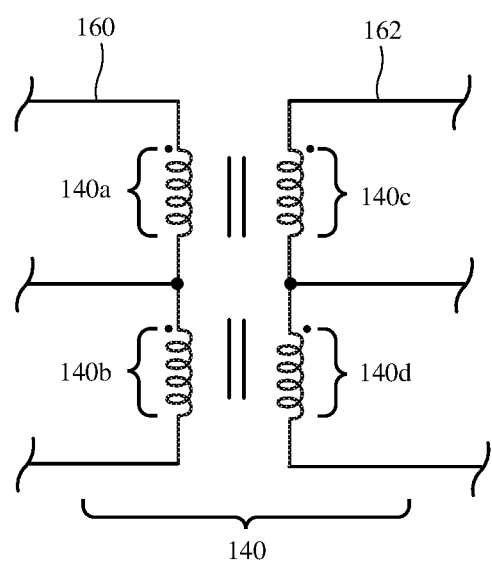
FIG. 6 is a diagram of an illustrative complementary degeneration transformer in accordance with some embodiments.

FIG. 6 is a schematic diagram that illustrates the coupling relationship of the various inductive windings within the degeneration transformer circuitry. As shown in FIG. 6, degeneration transformer 140 includes primary windings 140a and 140b inductively coupled to secondary windings 140c and 140d, respectively. In particular, primary winding 140a is paired with and faces secondary winding 140c, whereas primary winding 140b is paired with and faces secondary winding 140d. In one embodiment, primary winding 140a may directly overlap secondary winding 140c (e.g., coil 140a may be formed directly above or below coil 140c). Similarly, primary winding 140b may directly overlap secondary winding 140d (e.g., coil 140b may be formed directly above or below coil 140d). This layout is merely illustrative. If desired, other transformer structures may be implemented to provide the required inductive coupling between the primary and secondary windings. This configuration in which inductive degeneration is provided on both the upper half and the lower half of the low noise amplifier is sometimes referred to herein as complementary transformer degeneration. The terms "primary" and "secondary" windings used to refer to the various coils in transformer 140 are merely illustrative and may be interchanged. Alternatively, windings 140c and 140d in the upper degeneration sub-circuit 66-2 may be referred to as primary windings while windings 140a and 140b in the lower degeneration sub-circuit 66-1 may be referred to as secondary windings.

Input impedance quality factor compensation circuit 68 may be selectively coupled to input RFIN (see FIG. 4). Compensation circuit 68 may include a first capacitor 170 having a first terminal coupled to RFIN and a second terminal coupled to source node 160 via an n-type switching transistor 172. Transistor 172 may have a gate terminal configured to receive enable signal EN_DeQ. Compensation circuit 68 may also include a second capacitor 174 having a first terminal coupled to RFIN and a second terminal coupled to source node 162 via a p-type switching transistor 176. Transistor 176 may have a gate terminal configured to receive an inverted version of enable signal EN_DeQ (see/ EN_DeQ). When signal EN_DeQ is asserted (e.g., driven high), complementary signal/EN_DeQ will be driven low, which will turn on both switches 172 and 176. Operated in this way, capacitors 170 and 174 will both be switched into use, which provide additional capacitance at RFIN.

As an example, capacitors 170 and 174 may be implemented as metal-oxide-metal (MOM) capacitors. As another example, capacitors 170 and 174 might be implemented as metal-insulator-metal (MIM) capacitors. As yet other examples, capacitors 170 and 174 may be implemented as metal-oxide-semiconductor capacitors (MOSCAPs), metal fringe capacitors, trench capacitors, junction capacitors, a combination of these capacitors, or other suitable types of semiconductor capacitive structures. When signal EN_DeQ is deasserted (e.g., driven low), complementary signal/ EN_DeQ will be driven high, which will turn off both switches 172 and 176. Operated in this way, capacitors 170 and 174 will be switched out of use to effectively decrease the overall capacitance contributed by compensation circuit 68 at RFIN. Adjusting the capacitance at input RFIN can help fine tune the input impedance of low noise amplifier 52 during different modes of operation.

Figure 7:
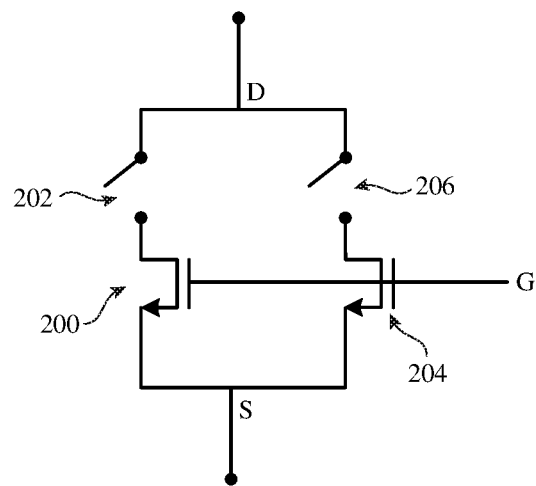
FIG. 7 is a diagram showing how an n-type transistor in an amplifier input stage can have configurable sizing in accordance with some embodiments.

Although each of the n-type amplifier input transistors such as transistors 100 and 120 are shown as a single transistor, each of these transistors may in fact be implemented as multiple transistors switchably coupled in parallel to provide configurable sizing. FIG. 7 is a diagram showing how an n-type transistor in an amplifier input stage such as transistor 100 and transistor 120 can each include multiple parallel transistors to provide adjustable drive strength. As shown in FIG. 7, an n-type amplifier input transistor may include two n-type transistors 200 and 204 coupled in parallel between drain node D and source node S. The gate terminals of transistors 200 and 204 may be shorted to common gate node G. Transistors 200 and 204 may have the same size or different sizes. Configurations in which transistors 200 and 204 exhibit the same size are sometimes described herein as an example.

Transistor 200 may be coupled in series with a first switch 202 between nodes D and S. Transistor 204 may be coupled in series with a second switch 206 between nodes D and S. When both switches 202 and 206 are turned on, transistors 200 and 204 will be activated. Activating both transistors 200 and 204 places the n-type amplifier input transistor in a 2× mode that maximizes the drive strength of the overall amplifier input transistor, which can increase the gain of the amplifier input stage while also introducing more transistor parasitic capacitance (e.g., by adding to the G terminal more gate-to-source capacitance Cgs and gate-to-drain capacitance Cgd associated with transistors 200 and 204). When only one of switches 202 and 206 is turned on, a single one of transistors 200 and 204 is activated. Activating only one of transistors 200 and 204 places the amplifier input transistor in a 1× mode with less drive strength than the 2× mode, which decreases the gain of the amplifier input stage while also removing the Cgs and Cgd associated with the deactivated transistor. When both switches 202 and 206 are turned off, the overall amplifier input transistor will be disabled and thus operate in an idle state.

Figure 8:
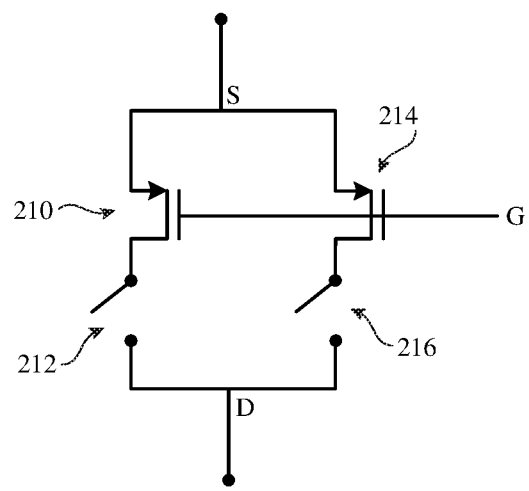
FIG. 8 is a diagram showing how a p-type transistor in an amplifier input stage can have configurable sizing in accordance with some embodiments.

Although each of the p-type amplifier input transistors such as transistors 120 and 122 are shown as a single transistor in FIG. 4, each of these transistors may in fact be implemented as multiple transistors switchably coupled in parallel to provide configurable sizing. FIG. 8 is a diagram showing how a p-type transistor in an amplifier input stage such as transistor 120 and transistor 122 can each include multiple parallel transistors to provide adjustable drive strength. As shown in FIG. 8, a p-type amplifier input transistor may include two p-type transistors 210 and 214 coupled in parallel between drain node D and source node S. The gate terminals of transistors 210 and 214 may be shorted to common gate node G. Transistors 210 and 214 may have the same size or different sizes. Configurations in which transistors 210 and 214 exhibit the same size are sometimes described herein as an example.

Transistor 210 may be coupled in series with a first switch 212 between nodes D and S. Transistor 214 may be coupled in series with a second switch 216 between nodes D and S. When both switches 212 and 216 are turned on, transistors 210 and 214 will be activated. Activating both transistors 210 and 214 places the p-type amplifier input transistor in a 2× mode that maximizes the drive strength of the overall amplifier input transistor, which can increase the gain of the amplifier input stage while also introducing more transistor parasitic capacitance Cgs and Cgd associated with transistors 210 and 214). When only one of switches 212 and 216 is turned on, a single one of transistors 210 and 214 is activated. Activating only one of transistors 210 and 214 places the p-type amplifier input transistor in a 1× mode with comparatively less drive strength than the 2× mode, which decreases the gain of the amplifier input stage while also removing the Cgs and Cgd associated with the deactivated transistor. When both switches 212 and 216 are turned off, the overall p-type amplifier input transistor will be disabled and thus operate in an idle state.

Figure 9:
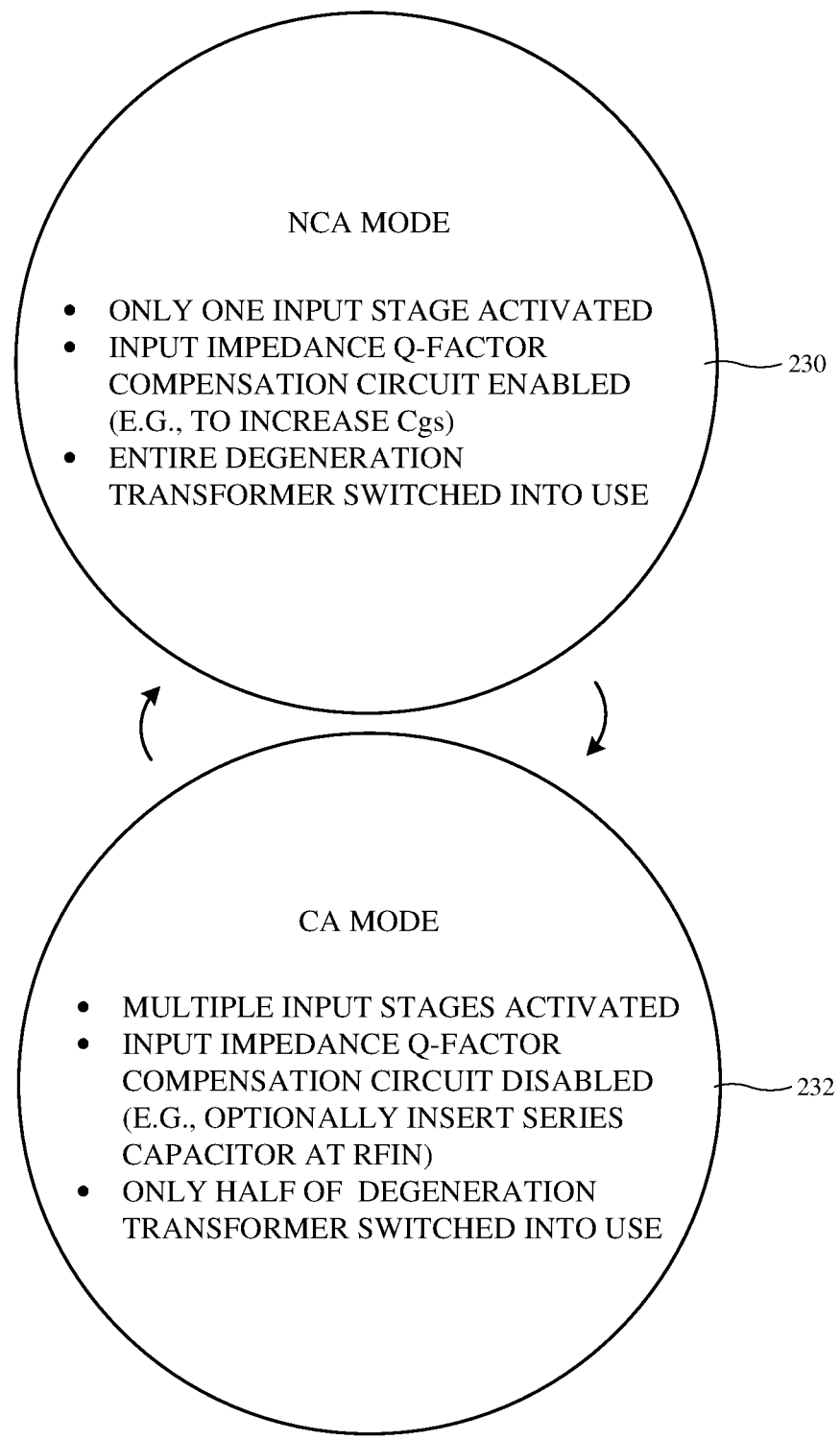
FIG. 9 is a state diagram showing how an illustrative low noise amplifier is operable in a non-carrier-aggregation mode and a carrier-aggregation mode in accordance with some embodiments.

Device 10 that can support carrier aggregation may include a low noise amplifier 52 that is operable in a non-carrier-aggregation (NCA) mode and a carrier-aggregation (CA) mode. FIG. 9 is a state diagram illustrating how the low noise amplifier may toggle between NCA mode 230 and CA mode 232. When low noise amplifier 52 is operated in NCA mode 230, only one of the two amplifier input stages is activated. For example, only the first input stage 62 is turned on while the second input stage 64 is turned off (idled). Alternatively, only the second input stage 64 might be active while the first input stage 62 is deactivated. During NCA mode 230, input impedance Q factor compensation circuit 68 may be enabled by asserting signal EN_DeQ to increase the gate-to-source capacitance Cgs at the amplifier input RFIN. Increasing Cgs at the LNA input port in this way may decrease the quality factor of the input impedance, which can help equalize the imaginary part of the input impedance during the NCA mode. While the low noise amplifier is operating in NCA mode 230, the entire degeneration transformer is switched into use (e.g., by asserting enable signal EN_NCA while deasserting signal EN_CA). When all of the transformer coils are in use, the total inductance of the degeneration transformer is maximized, which reduces the gain of the low noise amplifier.

When low noise amplifier 52 is operated in CA mode 232, multiple amplifier input stages are activated. For example, the first input stage 62 and the second input stage 64 may both be turned on. During CA mode 232, input impedance Q factor compensation circuit 68 may be disabled by deasserting signal EN_DeQ. Instead of activating compensation circuit 68 to decrease the Q factor of the input impedance during the NCA mode, a series capacitor may optionally be interposed on the RFIN port during the CA mode to help equalize the imaginary part of the input impedance during the CA mode. While the low noise amplifier is operating in CA mode 232, only a portion degeneration transformer is switched into use (e.g., by asserting enable signal EN_CA while deasserting signal EN_NCA). When only half of the transformer coils are in use, the total inductance of the degeneration transformer is halved, which increases the gain of the low noise amplifier.

Figure 10:
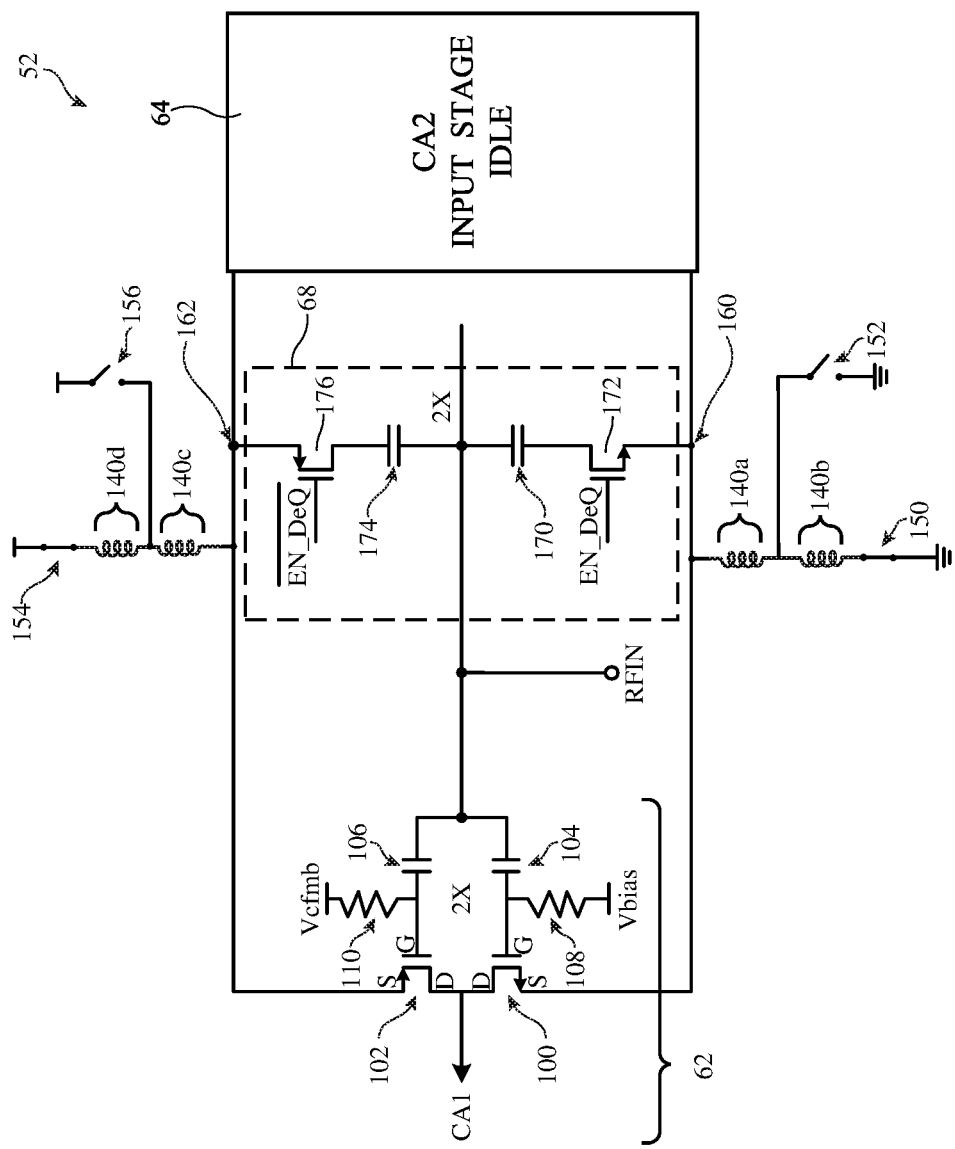
FIG. 10 is a circuit diagram of an illustrative low noise amplifier operating in the non-carrier-aggregation mode in accordance with some embodiments.

FIG. 10 is a diagram of low noise amplifier 52 operating in the non-carrier-aggregation (NCA) mode. In the example of FIG. 10, only the first amplifier input stage 62 is active while the second amplifier input stage 64 is idle. Switch 150 is turned on while switch 152 is turned off, which enables both primary windings 140a and 140b. Similarly, switch 154 is turned on while switch 156 is turned off, which enables both secondary windings 140c and 140d. Configured in this way, the inductance of the degeneration transformer is maximized. The input impedance of low noise amplifier 52 may have a real component and an imaginary component. Activating all of the inductors in the degeneration transformer effectively doubles the source degeneration, which changes the real component of the input impedance.

To maintain the imaginary component of the input impedance, Q factor compensation circuit 68 may be turned on (e.g., by asserting or driving high enable signal EN_DeQ) to introduce additional capacitance at input RFIN. Circuit 68 may therefore be used to ensure that input impedance matching is maintained when switching between the NCA mode and the CA mode. During the NCA mode, both the first input stage 62 and the input impedance Q factor compensation circuit 68 operate in a 2× mode (see "2×" notation in FIG. 10). As described in connection with FIGS. 7 and 8, the 2× operating mode is when both the parallel n-type transistors 200 and 204 within transistor 100 are turned on and both the parallel p-type transistors 210 and 214 within transistor 102 are turned on to maximize the size, drive strength, and gain of the first amplifier input stage. Although compensation circuit 68 shows only one capacitor 170 coupled between RFIN and node 160 and one capacitor 174 coupled between RFIN and node 162, each of these capacitors may in fact be implemented as two parallel capacitors, one or both of which can be switched into use. Operating compensation circuit 68 in the 2× mode will turn on both capacitors within component 170 and will turn on both capacitors within component 174. As a result, the total input loading will be denoted as having a 4× capacitive load.

The examples shown in FIGS. 4 and 10 in which input impedance quality factor compensation circuit 68 is implemented using capacitors 170 and 174 (e.g., MOM capacitors, MIM capacitors, or other semiconductor capacitor structure) that can be turned on using associated switches 172 and 176 is merely illustrative. Other suitable implementations for introducing additional Cgs capacitance at input RFIN may also be used.

Figure 11:
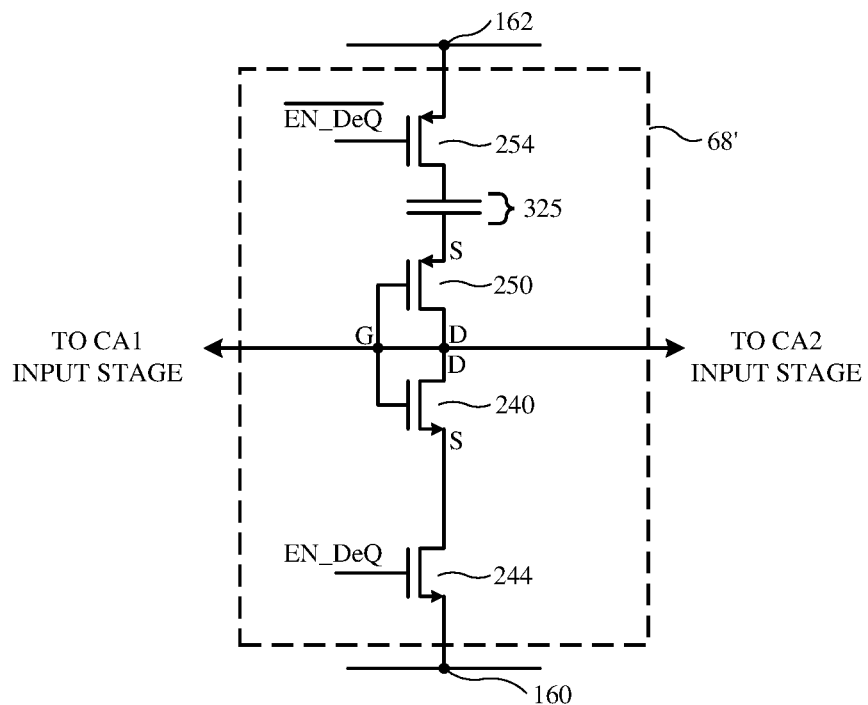
FIG. 11 is a diagram of an illustrative input impedance quality factor reduction circuit implemented using metal-oxide-semiconductor transistors in accordance with some embodiments.

FIG. 11 illustrates another suitable implementation of input impedance Q factor compensation circuit 68'. As shown in FIG. 0.11, compensation circuit 68' may include an n-type transistor 240 having gate and drain terminals coupled to the first and second amplifier input stages (e.g., to RFIN) and a source terminal coupled to source node 160 via switch 244. Compensation circuit 68' may also include a p-type transistor 250 having gate and drain terminals coupled to the first and second amplifier input stages (e.g., to RFIN) and a source terminal coupled to source node 162 via coupling capacitor 252 and switch 254. Switches 244 and 254 may be turned on by asserting (e.g., driving high) enable signal EN_DeQ, which drives the corresponding inverted enable signal/EN_DeQ low. N-type transistor 240 may have similar sizing and structure as transistor 100 or transistor 120 of the amplifier input stages. P-type transistor 250 may have similar sizing and structure as transistor 102 and 122 in the amplifier input stages. Compensation circuit 68' may also be operable in a 1× and 2× driving mode. Although compensation circuit 68' shows only one n-type transistor 240 coupled between RFIN and switch 244 and one p-type transistor 250 coupled between RFIN and capacitor 252, each of these transistors may in fact be implemented as two parallel transistors, one or both of which can be switched into use (see, e.g., FIGS. 7 and 8). In the 1× driving mode, only one of the two transistors in components 240 and 250 will be turned on. In the 2× driving mode, both of the parallel transistors in components 240 and 250 will be turned on to maximize the size and drive strength of circuit 68'.

Figure 12:
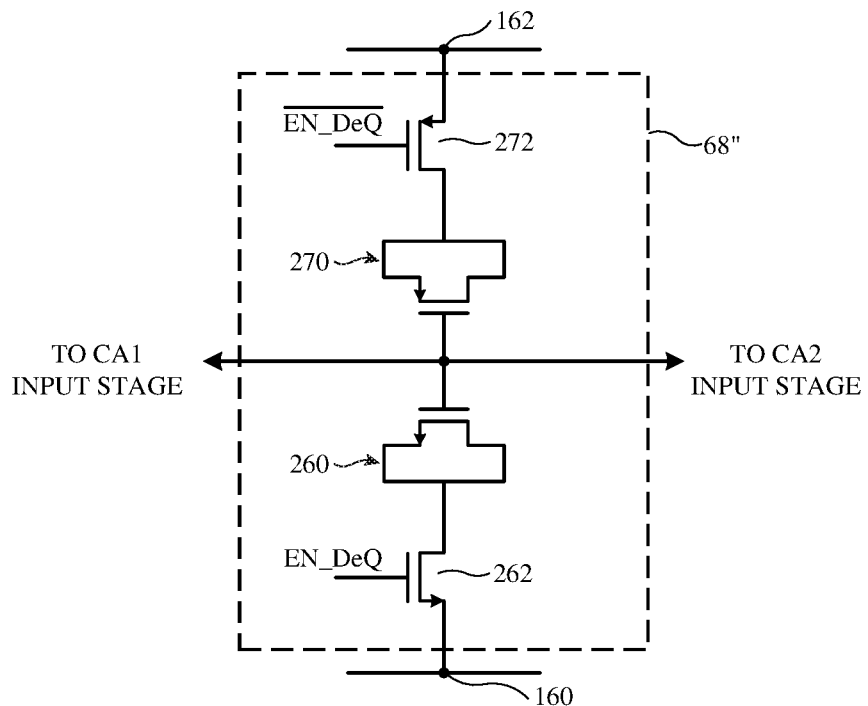
FIG. 12 is a diagram of an illustrative input impedance quality factor reduction circuit implemented using metal-oxide-semiconductor capacitors in accordance with some embodiments.

FIG. 12 illustrates yet another suitable implementation of input impedance Q factor compensation circuit 68". As shown in FIG. 0.12, compensation circuit 68" may include an n-type metal-oxide-semiconductor capacitor 260 (sometimes referred to as a MOS capacitor or MOSCAP) having a gate terminal coupled to the first and second amplifier input stages (e.g., to RFIN) and a body (bulk) terminal coupled to source node 160 via switch 262. Compensation circuit 68" may also include a p-type metal-oxide-semiconductor capacitor 270 having a gate terminal coupled to the first and second amplifier input stages (e.g., to RFIN) and a source terminal coupled to source node 162 via switch 272. Switches 262 and 272 may be turned on by asserting (e.g., driving high) enable signal EN_DeQ, which drives the corresponding inverted enable signal/EN_DeQ low. N-type MOS capacitor 260 may have similar sizing and structure as transistor 100 or transistor 120 of the amplifier input stages. P-type MOS capacitor 270 may have similar sizing and structure as transistor 102 and 122 in the amplifier input stages. Compensation circuit 68" may also be operable in a 1× and 2× driving mode. Although compensation circuit 68" shows only one n-type MOSCAP 260 coupled between RFIN and switch 262 and one p-type MOSCAP 270 coupled between RFIN and switch 272, each of these MOSCAPs may in fact be implemented as two parallel MOS capacitors, one or both of which can be switched into use. In the 1× driving mode, only one of the two MOS capacitors in each of components 260 and 270 will be turned on. In the 2× driving mode, both of the parallel MOS capacitors in each of components 260 and 270 will be turned on to maximize the size and drive strength of circuit 68".

The three different implementations of the input impedance Q factor control circuit shown in FIGS. 10-12 are merely illustrative. If desired, other ways of selectively decreasing the quality factor of the amplifier input impedance during the NCA mode may be used, which may include other ways of adding a capacitive load at RFIN using one or more associated switching circuits.

Figure 13:
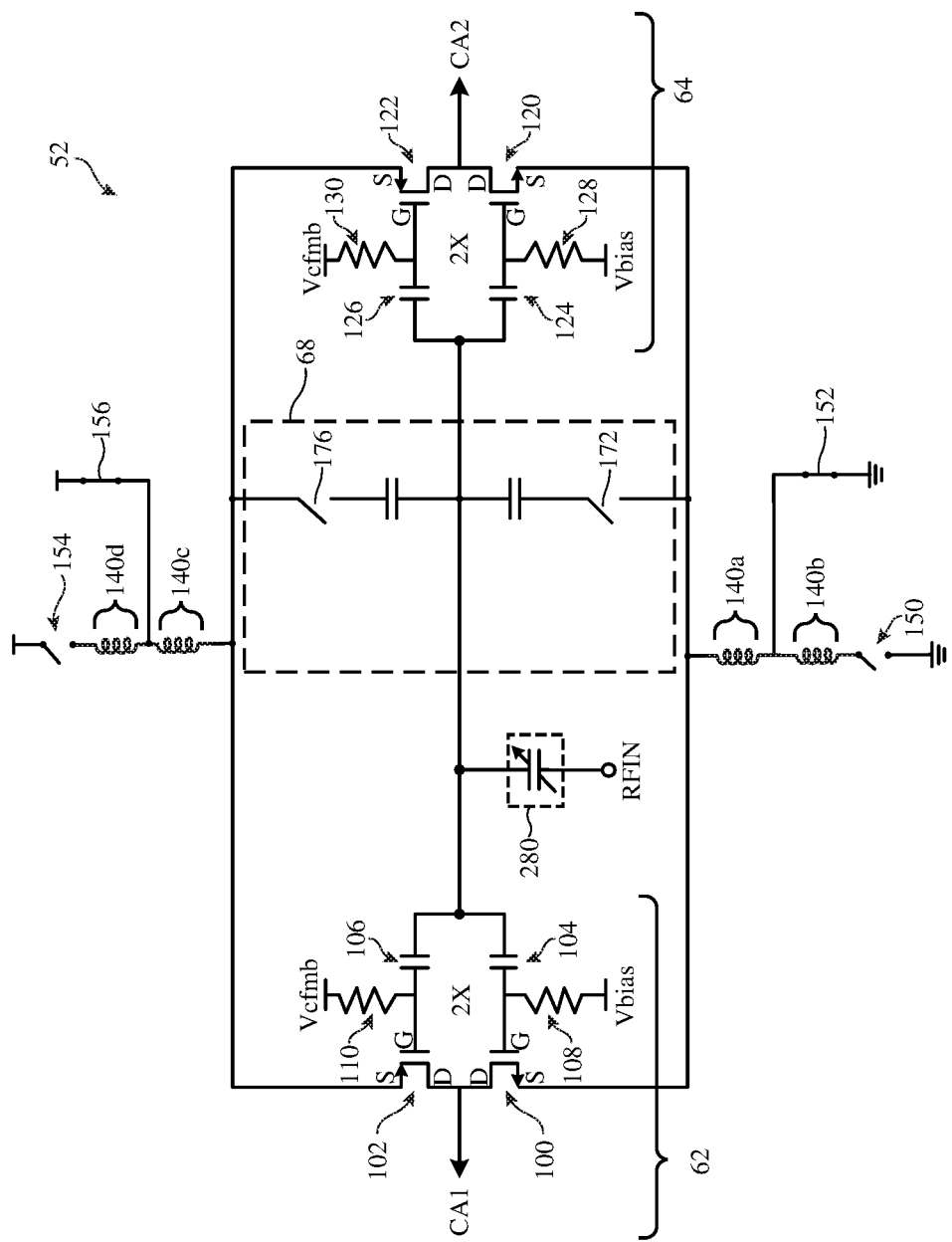
FIG. 13 is a circuit diagram of an illustrative low noise amplifier operating in the carrier-aggregation mode in accordance with some embodiments.

FIG. 13 is a diagram of low noise amplifier 52 operating in the carrier-aggregation (CA) mode. In the CA mode of operation, both the first amplifier input stage 62 and the second amplifier input stage 64 are active. Switch 150 is turned off while the center tap switch 152 is turned on, which enables only half of the primary windings (e.g., only primary winding 140a is switched into use). Similarly, switch 154 is turned off while the center tap switch 156 is turned on, which enables only half of the secondary windings (e.g., only secondary winding 140c is switched in to use). Configured in this way, the inductance of the degeneration transformer is halved relative to the NCA mode. Activating only a portion of the inductors in the degeneration transformer effectively halves the source degeneration, which changes the real component of the input impedance.

To maintain the imaginary component of the input impedance, Q factor compensation circuit 68 may be turned off (e.g., by deasserting or driving low enable signal EN_DeQ). Circuit 68 may therefore be turned off to ensure that input impedance matching is maintained when switching from the NCA mode to the CA mode. During the CA mode, both the first input stage 62 and second input stage 64 operate in the 2× mode (see "2×" notation in FIG. 13). In other words, both parallel transistors within each of n-type transistors 100 and 120 are turned on. Similarly, both parallel transistors within each of p-type transistors 102 and 122 are also turned on. As a result, the total input loading will be denoted as having a 4× capacitive load. By reducing the amount of source degeneration while splitting the RF input signal between the two amplifier input stages, the voltage gain and the input impedance of low noise amplifier 52 may be maintained when switching from the NCA mode to the CA mode.

The example shown in FIGS. 10-12 in which input impedance quality factor compensation circuit 68 is turned on to decrease the Q factor of the input impedance during the NCA mode to maintain input matching is merely illustrative. In another embodiment, low noise amplifier 52 may include a series capacitor interposed on the input port RFIN. In FIG. 13, series capacitor 280 is configured to increase the series capacitance at the amplifier input port, which effectively increases the quality factor of the input impedance during the CA mode (as opposed to decreasing the quality factor of the input impedance during the NCA mode). Series capacitor 280 may be considered to be part of the input impedance compensation circuit 68. Capacitor 280 may therefore sometimes be referred to herein a quality factor boosting circuit. Capacitor 280 may be a capacitive bank, an array of capacitors, or other variable capacitor structure that can be dynamically adjusted to provide the desired capacitance value.

During the NCA mode, capacitor 280 may be controlled (e.g., using control circuitry 14 or other control circuitry or processor within wireless circuitry 24) to provide a small amount of capacitance (e.g., zero capacitance or other suitable low capacitance value). During the CA mode, capacitor 280 may be adjusted using the control circuitry to provide a larger amount of series capacitance to provide the requisite amount of input impedance matching. Adjustable series capacitor 280 may or may not be used in conjunction with circuit 68. In one example, amplifier 52 includes quality factor reduction circuit 68 but does not include quality factor boosting circuit 280. In another example, amplifier 52 includes quality factor boosting circuit 280 but does not include quality factor reduction circuit 68. In another example, amplifier 52 includes both quality factor reduction circuit 68 and quality factor boosting circuit 280. The use of circuits 68 and 280 need not be mutually exclusive.

Figure 14:
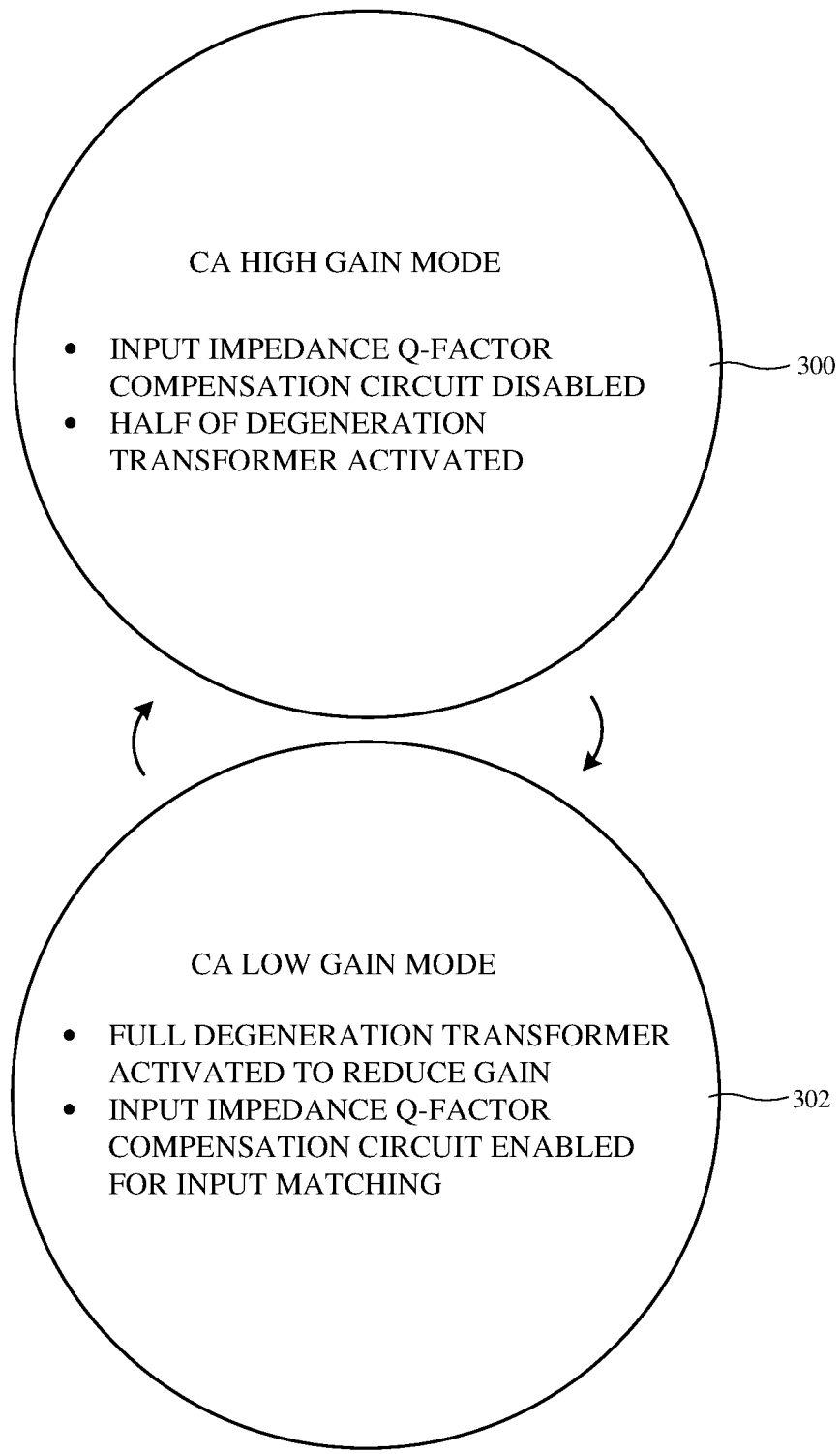
FIG. 14 is a state diagram showing how an illustrative low noise amplifier is operable in a high-gain carrier-aggregation mode and a low-gain carrier-aggregation mode in accordance with some embodiments.

The exemplary configuration of low noise amplifier 52 shown in FIG. 13 is when amplifier 52 is being operated to provide a maximum amount of gain during the CA mode. Amplifier 52 may also be operated to provide a lower gain during the CA mode. FIG. 14 is a state diagram showing how the low noise amplifier may toggle between a carrier-aggregation (CA) high gain mode 300 and a carrier-aggregation (CA) low gain mode 302 in accordance with an embodiment. During the CA high gain mode 300, low noise amplifier 52 may be used to provide a maximum amount of gain for both input stages. The CA high gain mode 300 may therefore sometimes be referred to as a maximum gain mode or normal gain mode. During the CA low gain mode, low noise amplifier 52 may be used to provide a minimal amount of gain for the two input stages. For example, relative to the CA high gain mode 300, the CA low gain mode 302 may provide at least 3 dB less voltage gain, at least 4 dB less voltage gain, at least 5 dB less voltage gain, at least 6 dB less voltage gain, 3 to 6 dB less voltage gain, more than 6 dB less voltage gain, 3 to 7 dB less voltage gain, 3 to 8 dB less voltage gain, 3 to 9 dB less voltage gain, or other suitable gain step. The CA low gain mode 302 may therefore sometimes be referred to as a minimum gain mode or reduced gain mode.

During the CA high gain mode 300, as shown in the example of FIG. 13, the input impedance compensation circuit 68 is turned off. Only half of the degeneration transformer is activated by turning on only the center tap switches 152 and 156. Turning on only half of the degeneration transformer inductance while operating input stage 62 and input stage 64 in the 2× mode maximizes the gain of the overall low noise amplifier 52.

Figure 15:
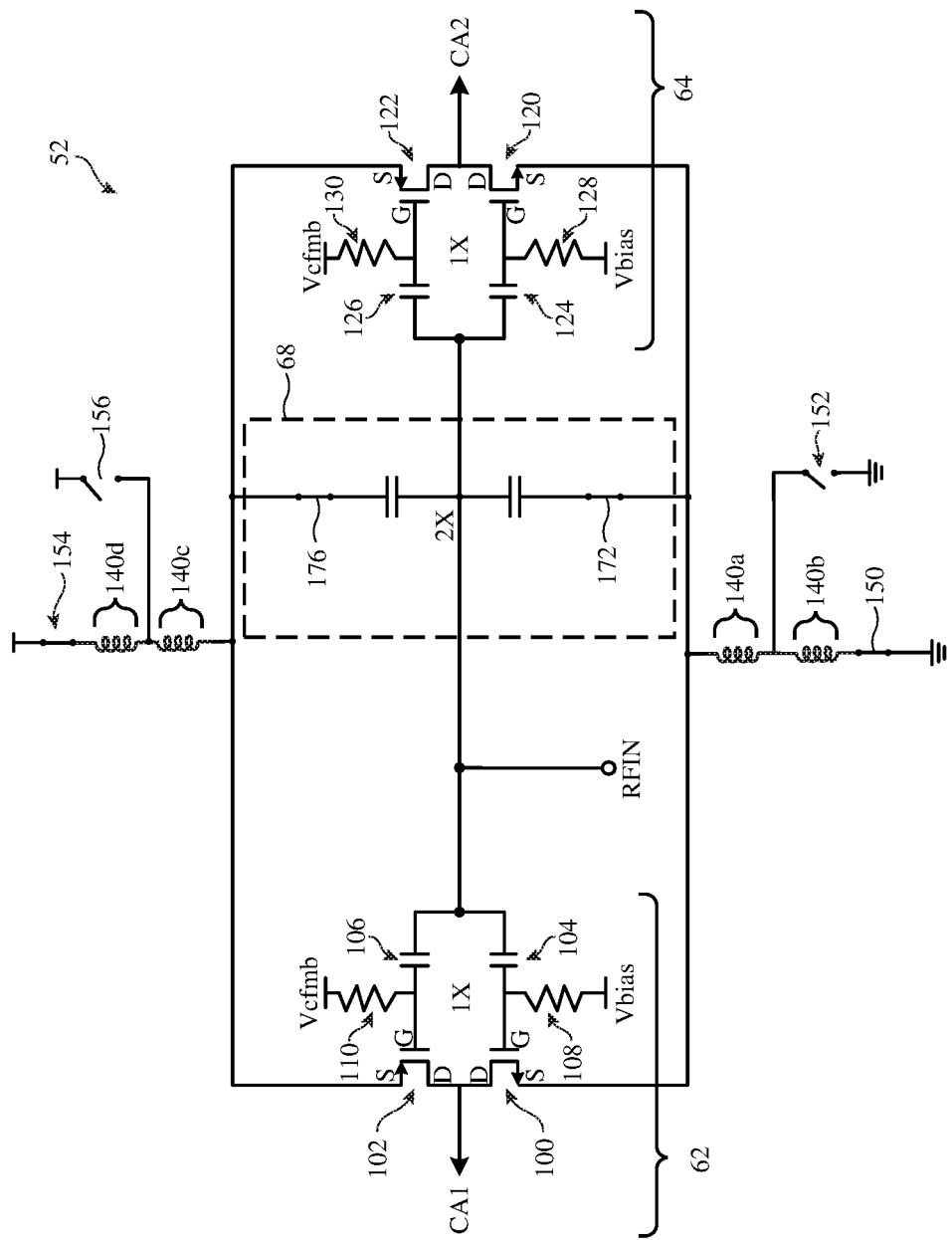
FIG. 15 is a circuit diagram of an illustrative low noise amplifier operating in the low-gain carrier-aggregation mode in accordance with some embodiments.

During the CA low gain mode 302, all of the inductors within the degeneration transformer circuitry may be activated to reduce the amplifier gain while the input impedance control circuit is enabled for input matching. FIG. 15 illustrates low noise amplifier 52 operating in the CA low gain mode 302. As shown in FIG. 15, the entire degeneration transformer may be activated by turning off the center tap switches 152 and 156 while turning on switches 150 and 154. Activating both of the primary windings 140a and 140b and both of the secondary windings 140c and 140d effectively doubles the degeneration inductance, which reduces the overall gain of the low noise amplifier 52. First amplifier input stage 62 may be operated in the 1× mode (e.g., by disabling half of the parallel switches within each of transistors 100 and 102) to further reduce the drive strength and gain of the first input stage. Similarly, second amplifier input stage 64 may also be operated in the 1× mode (e.g., by disabling half of the parallel switches within each of transistors 120 and 122) to further reduce the drive strength and gain of the second input stage. To maintain the imaginary part of the input impedance of amplifier 52, input impedance compensation circuit 68 may be activated (e.g., by turning on switches 172 and 176). Circuit 68 may operate in the 2× mode to maintain the total input loading at 4×. If desired, intermediate CA gain modes may be achieved by optionally operating the first and second input stages in the 2× drive mode.

Figure 16:
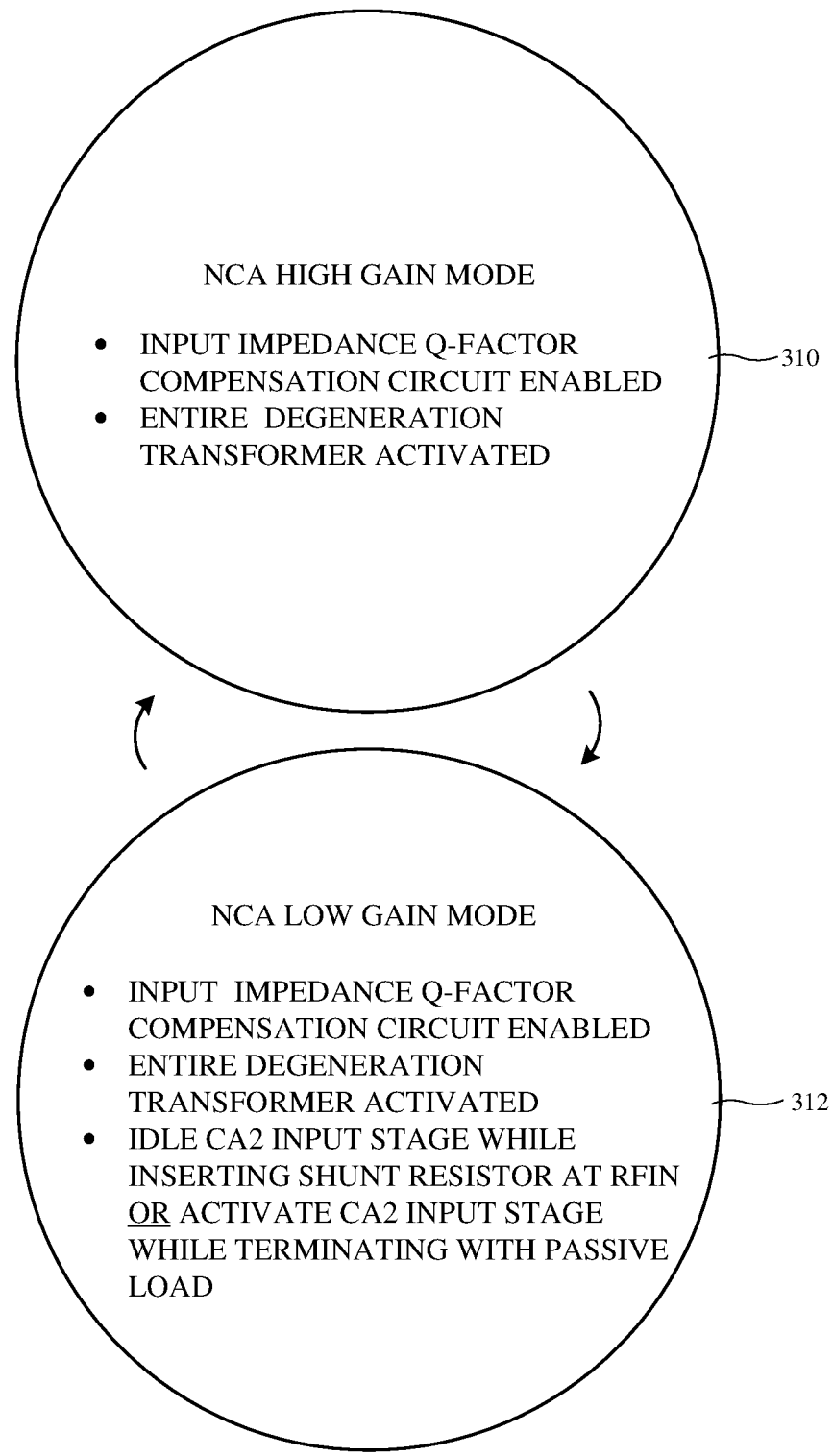
FIG. 16 is a state diagram showing how an illustrative low noise amplifier is operable in a high-gain non-carrier-aggregation mode and a low-gain non-carrier-aggregation mode in accordance with some embodiments.

The exemplary configuration of low noise amplifier 52 shown in FIG. 10 is when amplifier 52 is being operated to provide a maximum amount of gain during the NCA mode. Amplifier 52 may also be operated to provide a lower gain during the NCA mode. FIG. 16 is a state diagram showing how the low noise amplifier may toggle between a non-carrier-aggregation (NCA) high gain mode 310 and a non-carrier-aggregation (NCA) low gain mode 312 in accordance with an embodiment. During either modes, only the first input stage 62 is turned on while the second input stage 62 is turned off (or idled). During the NCA high gain mode 310, low noise amplifier 52 may be used to provide a maximum amount of gain for the first input stage 62. The NCA high gain mode 310 may therefore sometimes be referred to as an NCA maximum gain mode or NCA normal gain mode. During the NCA low gain mode 312, low noise amplifier 52 may be used to provide a minimal amount of gain for the first input stage 62. For example, relative to the NCA high gain mode 310, the NCA low gain mode 312 may provide at least 3 dB less voltage gain, at least 4 dB less voltage gain, at least 5 dB less voltage gain, at least 6 dB less voltage gain, 3 to 6 dB less voltage gain, more than 6 dB less voltage gain, 3 to 7 dB less voltage gain, 3 to 8 dB less voltage gain, 3 to 9 dB less voltage gain, or other suitable gain step. The NCA low gain mode 312 may therefore sometimes be referred to as an NCA minimum gain mode or NCA reduced gain mode.

During the NCA high gain mode 310, as shown in the example of FIG. 10, the input impedance compensation circuit 68 is turned on for input matching purposes. The entire the degeneration transformer is activated by turning off the center tap switches 152 and 156 while turning on switches 150 and 154. Turning on all of the inductors in the degeneration transformer while operating first input stage 62 and compensation circuit 68 in the 2× mode maximizes the gain of the overall low noise amplifier 52 during the NCA mode.

During the NCA low gain mode 312, all of the inductors within the degeneration transformer circuitry remain activated to keep the amplifier gain low. The input impedance control circuit remains enabled for input matching purposes. During operation of the NCA low gain mode, the second amplifier input stage 64 may sit idle while a shunt resistor is coupled at the RF input port for input matching purposes or, alternatively, the second amplifier input stage 64 may be turned on but terminated with a passive load.

Figure 17:
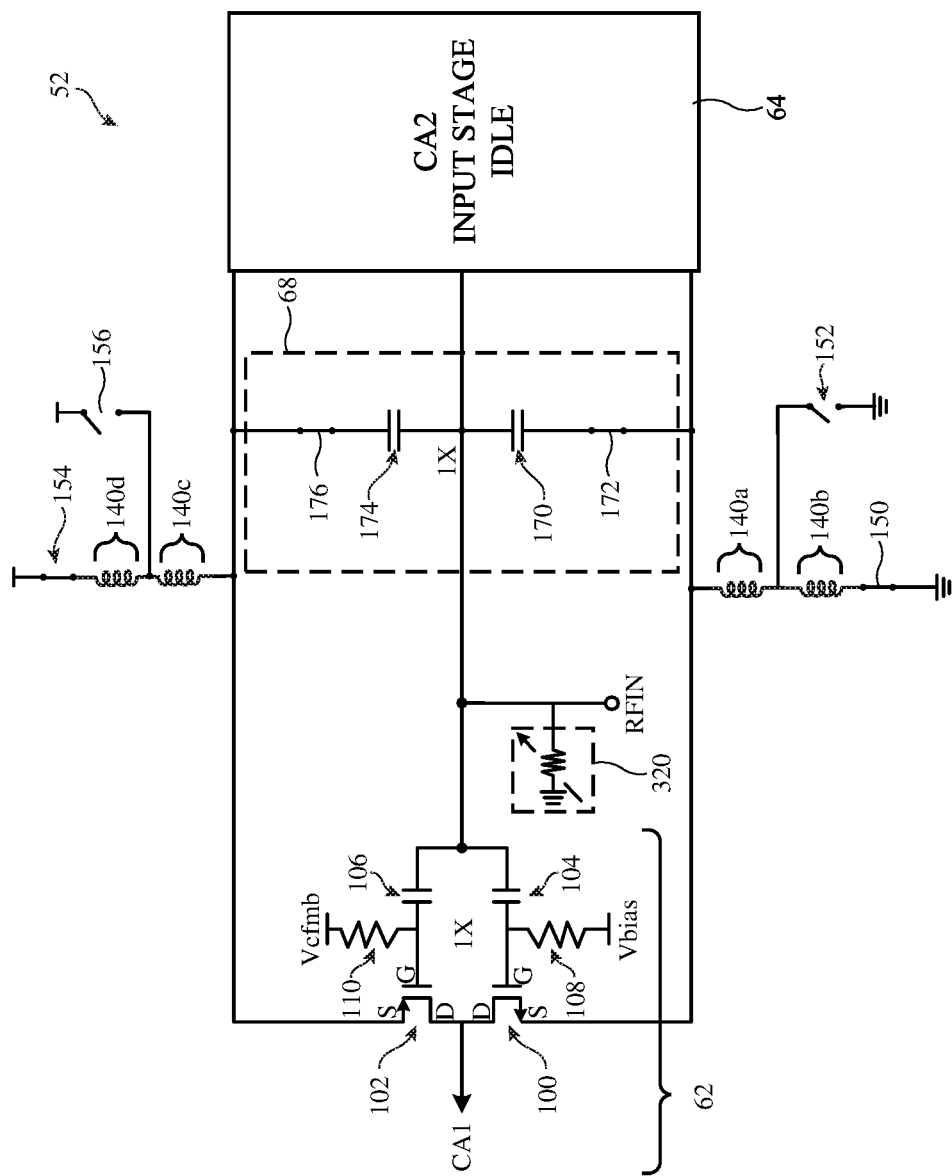
FIG. 17 is a circuit diagram of an illustrative low noise amplifier operating in the low-gain non-carrier-aggregation mode with an idle second input stage in accordance with some embodiments.

FIG. 17 illustrates low noise amplifier 52 operating in the NCA low gain mode 312 in accordance with an embodiment. As shown in FIG. 17, the entire degeneration transformer may be activated by turning off the center tap switches 152 and 156 while turning on switches 150 and 154. Activating both of the primary windings 140a and 140b and both of the secondary windings 140c and 140d effectively doubles the degeneration inductance, which reduces the overall gain of the low noise amplifier 52. The second amplifier input stage 64 may be turned off or placed in an idle state. First amplifier input stage 62 may be operated in the 1× mode (e.g., by disabling half of the parallel switches within each of transistors 100 and 102) to further reduce the drive strength and gain of the first input stage.

To maintain the imaginary part of the input impedance of amplifier 52, compensation circuit 68 may be activated (e.g., by turning on switches 172 and 176). Circuit 68 may operate in the 1× mode (e.g., by disabling half of the parallel capacitors within each of components 170 and 174). Shunt resistor 320 may be configured to help match the real part of the amplifier input impedance during the NCA low gain mode 312. Resistor 320 may be a resistive bank, an array of resistors, or other variable resistive structure that can be dynamically adjusted to provide the desired resistance value. During the CA mode, resistor 320 may be controlled (e.g., using control circuitry 14 or other control circuitry or processor within wireless circuitry 24) to provide a small amount of resistance (e.g., zero resistance or other suitable low resistive value). During the NCA mode, resistor 320 may be adjusted using the control circuitry to provide a larger amount of shunt resistance to provide the requisite amount for the input impedance matching.

Figure 18:
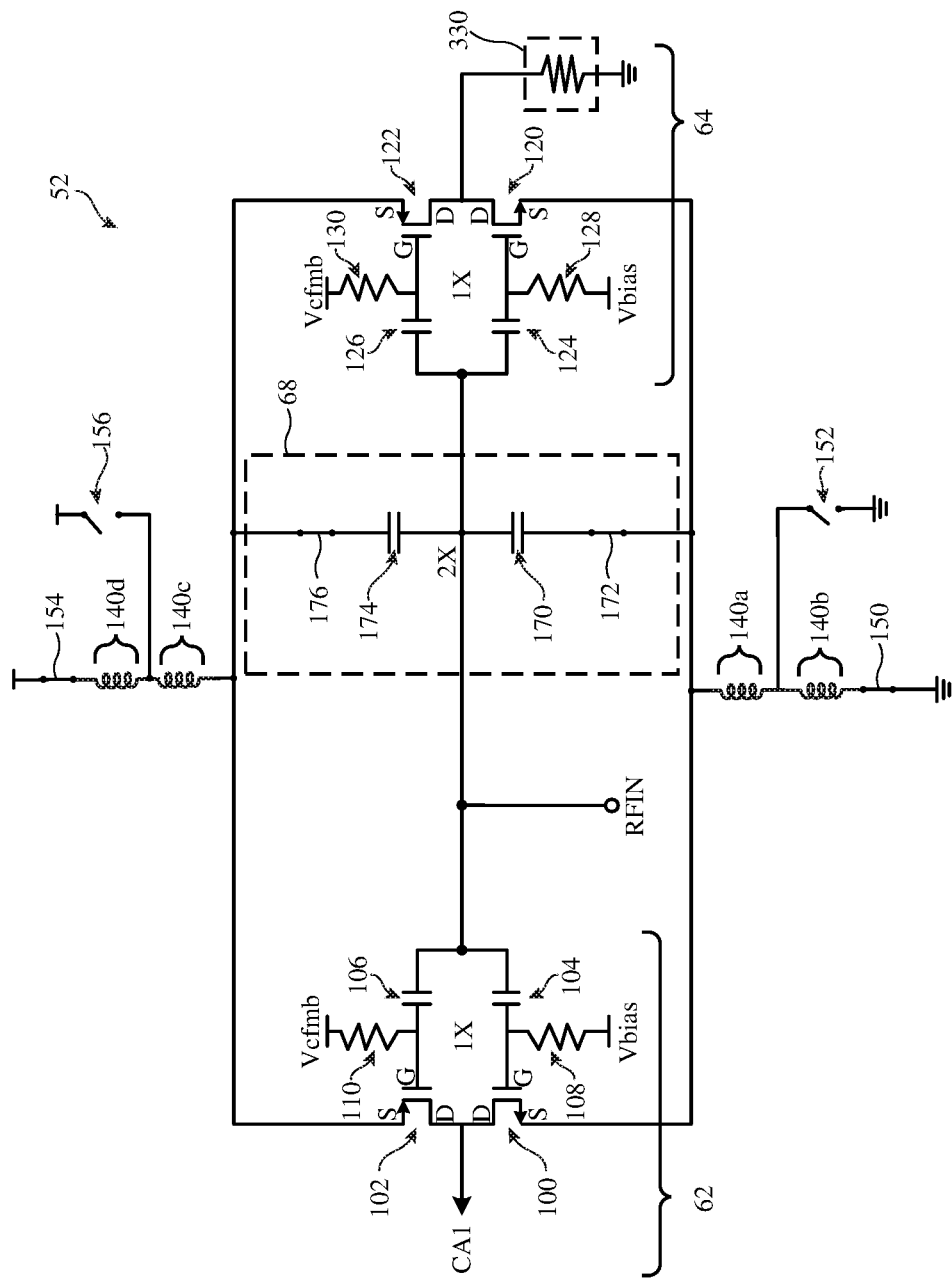
FIG. 18 is a circuit diagram of an illustrative low noise amplifier operating in the low-gain non-carrier-aggregation mode while the second input stage is terminated by a passive load in accordance with some embodiments.

The example of FIG. 17 in which the second input stage 64 is idle during the NCA low gain mode is merely illustrative. FIG. 18 illustrates another embodiment in which the second input stage 64 is also turned on when operating in the NCA low gain mode 312. As shown in FIG. 18, the entire degeneration transformer may be activated by turning off the center tap switches 152 and 156 while turning on switches 150 and 154. Activating both of the primary windings 140a and 140b and both of the secondary windings 140c and 140d effectively doubles the degeneration inductance, which reduces the overall gain of the low noise amplifier 52. The second amplifier input stage 64 may be turned on but terminated using a resistive load such as load 330. Resistive load 330 may have a resistance equal to 30 Ω, 40 Ω, 50 Ω, 60 Ω, 20-40 Ω, 10-50 Ω, 20-60Ω, less than 30Ω, greater than 30Ω, greater than 50 Ω, 30-100 Ω, 100-200Ω, hundreds or thousands of ohms, or other suitable resistance value. First amplifier input stage 62 may be operated in the 1× mode (e.g., by disabling half of the parallel switches within each of transistors 100 and 102) to further reduce the drive strength and gain of the first input stage. The second amplifier input stage 64 may also be operated in the 1× mode (e.g., by disabling half of the parallel switches within each of transistors 120 and 122). To main the imaginary part of the input impedance of amplifier 52, compensation circuit 68 may be activated (e.g., by turning on switches 172 and 176). Circuit 68 may operate in the 2× mode (e.g., by turning on both of the parallel capacitors within each of components 170 and 174).

The methods and operations described above in connection with FIGS. 1-18 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. Amplifier circuitry operable in a carrier-aggregation mode and a non-carrier-aggregation mode, the amplifier circuitry comprising:
   an input port configured to receive radio-frequency signals from an antenna;
   a first amplifier having a first input coupled to the input port;
   a second amplifier having a second input coupled to the input port;
   degeneration transformer circuitry coupled to the first and second amplifiers, the degeneration transformer circuitry having a first set of switches configured to activate and deactivate at least a portion of the degeneration transformer circuitry in the non-carrier-aggregation mode and the carrier-aggregation mode; and
   an input impedance compensation circuit coupled to the input port, the input impedance compensation circuit having a second set of switches configured to activate and deactivate at least a portion of the impedance compensation circuit in the non-carrier-aggregation mode and the carrier-aggregation mode.

2. The amplifier circuitry of claim 1, wherein the input impedance compensation circuit comprises:
a first capacitor coupled to one of the second set of switches in series between the input port and a first portion of the degeneration transformer circuitry; and
a second capacitor coupled to another one of the second set of switches in series between the input port and a second portion of the degeneration transformer circuitry.

3. The amplifier circuitry of claim 1, wherein the input impedance compensation circuit comprises:
a first transistor coupled to one of the second set of switches in series between the input port and a first portion of the degeneration transformer circuitry; and
a second transistor coupled to another one of the second set of switches in series between the input port and a second portion of the degeneration transformer circuitry.

4. The amplifier circuitry of claim 1, wherein the input impedance compensation circuit comprises:
a first metal-oxide-semiconductor capacitor coupled to one of the second set of switches in series between the input port and a first portion of the degeneration transformer circuitry; and
a second metal-oxide-semiconductor capacitor coupled to another one of the second set of switches in series between the input port and a second portion of the degeneration transformer circuitry.

5. The amplifier circuitry of claim 1, wherein the degeneration transformer circuitry comprises:
first and second primary windings having a first center tap, one of the first set of switches being coupled in series between the first and second primary windings and a ground line; and
a third switch coupled between the first center tap and the ground line, the third switch being deactivated in the non-carrier-aggregation mode and activated in the carrier-aggregation mode.

6. The amplifier circuitry of claim 5, wherein the degeneration transformer circuitry comprises:
first and second secondary windings having a second center tap, another one of the first set of switches being coupled in series between the first and second secondary windings and a power supply line; and
a fourth switch coupled between the second center tap and the power supply line, the fourth switch being deactivated in the non-carrier-aggregation mode and activated in the carrier-aggregation mode.

7. The amplifier circuitry of claim 1, wherein the first amplifier comprises:
at least two n-type transistors coupled in parallel; and
at least two p-type transistors coupled in parallel.

8. The amplifier circuitry of claim 1, wherein:
the first amplifier has a first source terminal and a second source terminal;
the second amplifier has a third source terminal and a fourth source terminal; and
the degeneration transformer circuitry has first coils coupled to the first source terminal and the third source terminal and has second coils coupled to the second source terminal and the fourth source terminal.

9. The amplifier circuitry of claim 1, wherein the input impedance compensation circuit comprises a series capacitor interposed between the input port and the input impedance compensation circuit.

10. The amplifier circuitry of claim 1, wherein the input impedance compensation circuit comprises a shunt resistor coupled to the input port.

11. The amplifier circuitry of claim 1, further comprising:
a resistive load coupled to an output of the second amplifier and configured to terminate the output of the second amplifier in the non-carrier-aggregation mode.

12. The amplifier circuitry of claim 1, wherein
the degeneration transformer circuitry has a first set of coils and second set of coils,
the first amplifier is coupled between the first set of coils and the second set of coils, and
the second amplifier is coupled between the first set of coils and the second set of coils.

13. The amplifier circuitry of claim 1, wherein:
the first amplifier has first and second n-type transistors coupled in parallel and first and second p-type transistors coupled in parallel; and
the second n-type transistor and the second p-type transistor are turned off to reduce a gain of the amplifier circuitry.

14. The amplifier circuitry of claim 1, wherein the input impedance compensation circuit comprises:
a first capacitive component coupled to the input port; and
a second capacitive component coupled in parallel with the first capacitive component, the second capacitive component being activated and deactivate to adjust a gain of the amplifier circuitry.

15. A method of operating amplifier circuitry, comprising:
with an input, receiving radio-frequency signals from an antenna;
with a first amplifier sub-circuit, receiving the radio-frequency signals from the input;
with a second amplifier sub-circuit, receiving the radio-frequency signals from the input;
in a non-carrier-aggregation mode, using the input to receive radio-frequency signals from one carrier frequency, activating the first amplifier sub-circuit, and deactivating the second amplifier sub-circuit;
in a carrier-aggregation mode, using the input to receive radio-frequency signals from at least two component carrier frequencies and activating the first and second amplifier sub-circuits;
with degeneration transformer circuitry coupled to the first and second amplifier sub-circuits, activating and deactivating a first set of switches to provide a first inductance in the non-carrier-aggregation mode and to provide a second inductance less than the first inductance in the carrier-aggregation mode; and
with an input impedance compensation circuit coupled to the input, activating and deactivating a second set of switches to match an input impedance at the input when switching between the non-carrier-aggregation mode and the carrier-aggregation mode.

16. The method of claim 15, wherein matching the input impedance at the input comprises:
in the non-carrier-aggregation mode, turning on the input impedance compensation circuit to add capacitance to the input by activating the second set of switches; and
in the carrier-aggregation mode, turning off the input impedance compensation circuit by deactivating the second set of switches.

17. The method of claim 15, further comprising:
using the first and second amplifier sub-circuits to amplify the received radio-frequency signals by a gain; and
adjusting the degeneration transformer circuitry to change the gain.

18. The method of claim 17, wherein the first amplifier sub-circuit has a configurable drive strength and the input impedance compensation circuit has a configurable size, the method further comprising:
adjusting the drive strength of the first amplifier sub-circuit to control the gain; and
adjusting the size of the input impedance compensation circuit to match the input impedance.

19. An electronic device operable in a carrier-aggregation mode and a non-carrier-aggregation mode, comprising:
an antenna configured to receive radio-frequency signals;
a transceiver configured to generate baseband signals based on the radio-frequency signals;
a baseband processor configured to receive the baseband signals; and
amplifier circuitry configured to receive, at an input, the radio-frequency signals from the antenna and to output corresponding amplified signals to the transceiver, the amplifier circuitry having
a first amplifier with a first carrier aggregation output,
a second amplifier with a second carrier aggregation output,
degeneration transformer circuitry coupled to the first and second amplifiers and having a first set of switches, and
an input impedance compensation circuit coupled to the input and having a second set of switches configured to enable and disable at least a portion of the input impedance compensation circuit in the non-carrier-aggregation mode and the carrier-aggregation mode.

20. The electronic device of claim 19, wherein the degeneration transformer circuitry comprises:
first and second primary coil windings with a first center tap;
first and second secondary coil windings with a second center tap;
a first switch in the first set of switches coupled in series between the first and second primary coil windings and a first power supply line, the first switch being configured to activate and deactivate at least the first primary coil winding in the non-carrier-aggregation mode and the carrier-aggregation mode;
a second switch in the first set of switches coupled between the first center tap and the first power supply line, the second switch being configured to activate and deactivate at least the second primary coil winding in the non-carrier-aggregation mode and the carrier-aggregation mode;
a third switch in the first set of switches coupled in series between the first and second secondary coil windings and a second power supply line, the third switch being configured to activate and deactivate at least the first secondary coil winding in the non-carrier-aggregation mode and the carrier-aggregation mode; and
a fourth switch in the first set of switches coupled between the second center tap and the second power supply line, the fourth switch being configured to activate and deactivate at least the second secondary coil winding in the non-carrier-aggregation mode and the carrier-aggregation mode.

* * * * *